US009828528B2

(12) United States Patent
Reiss et al.

(10) Patent No.: US 9,828,528 B2
(45) Date of Patent: Nov. 28, 2017

(54) POLISHING COMPOSITION CONTAINING CERIA ABRASIVE

(71) Applicant: Cabot Microelectronics Corporation, Aurora, IL (US)

(72) Inventors: Brian Reiss, Woodridge, IL (US); Dana Sauter Van Ness, Forest Park, IL (US); Viet Lam, Naperville, IL (US); Alexander Hains, Aurora, IL (US); Steven Kraft, Plainfield, IL (US); Renhe Jia, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 15/338,724

(22) Filed: Oct. 31, 2016

(65) Prior Publication Data

US 2017/0044403 A1 Feb. 16, 2017

Related U.S. Application Data

(62) Division of application No. 14/639,564, filed on Mar. 5, 2015, now Pat. No. 9,505,952.

(51) Int. Cl.
*C09G 1/02* (2006.01)
*B24B 1/00* (2006.01)
(Continued)

(52) U.S. Cl.
CPC .................. *C09G 1/02* (2013.01); *B24B 1/00* (2013.01); *B24B 37/044* (2013.01); *B24B 37/20* (2013.01);
(Continued)

(58) Field of Classification Search
None
See application file for complete search history.

(56) References Cited

U.S. PATENT DOCUMENTS

2004/0065022 A1* 4/2004 Machii .................... C09G 1/02
51/309
2006/0075688 A1* 4/2006 Takenouchi ............ C09G 1/02
51/307
(Continued)

FOREIGN PATENT DOCUMENTS

TW 201412908 A 4/2014

OTHER PUBLICATIONS

Taiwan Intellectual Property Office, Search Report issued in connection with Taiwan Patent Application No. 105106807 dated Oct. 11, 2016.

*Primary Examiner* — Jiong-Ping Lu
(74) *Attorney, Agent, or Firm* — Thomas Omholt; Erika S. Wilson; Ashlee B. Szelag

(57) ABSTRACT

The invention provides a chemical-mechanical polishing composition including first abrasive particles, wherein the first abrasive particles are wet-process ceria particles, have a median particle size of about 40 nm to about 100 nm, are present in the polishing composition at a concentration of about 0.005 wt. % to about 2 wt. %, and have a particle size distribution of at least about 300 nm, a functionalized heterocycle, a pH-adjusting agent, and an aqueous carrier, and wherein the pH of the polishing composition is about 1 to about 6. The invention also provides a method of polishing a substrate, especially a substrate comprising a silicon oxide layer, with the polishing composition.

14 Claims, 6 Drawing Sheets

Figure 1:
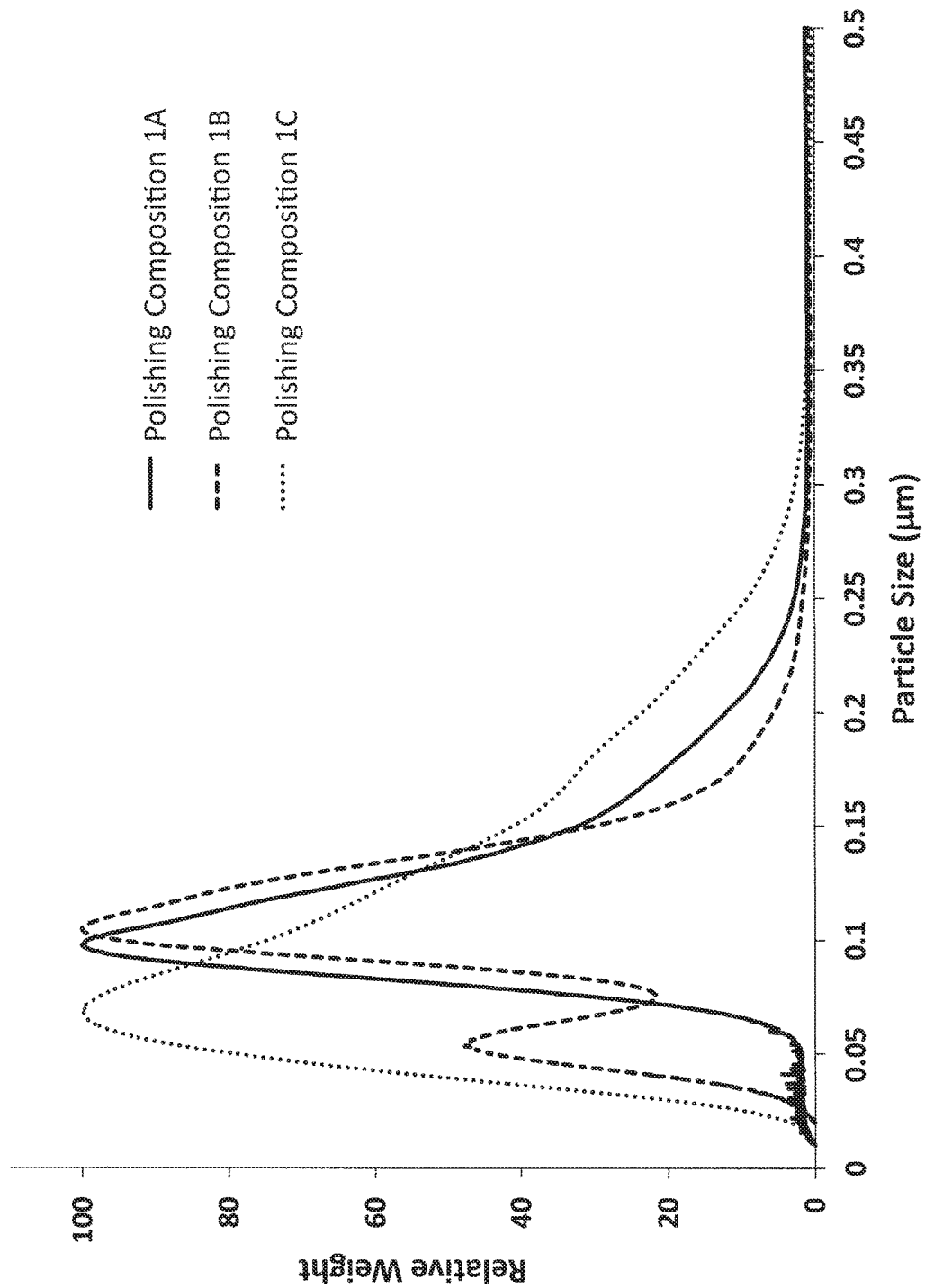

(51) Int. Cl.
  *B24B 37/04* (2012.01)
  *C09G 1/00* (2006.01)
  *C09G 1/04* (2006.01)
  *C09G 1/06* (2006.01)
  *C09K 3/14* (2006.01)
  *C09K 13/06* (2006.01)
  *H01L 21/306* (2006.01)
  *H01L 21/321* (2006.01)
  *H01L 21/3105* (2006.01)
  *B24B 37/20* (2012.01)

(52) U.S. Cl.
  CPC ............... *C09G 1/00* (2013.01); *C09G 1/04* (2013.01); *C09G 1/06* (2013.01); *C09K 3/1409* (2013.01); *C09K 3/1454* (2013.01); *C09K 3/1463* (2013.01); *C09K 13/06* (2013.01); *H01L 21/30625* (2013.01); *H01L 21/31053* (2013.01); *H01L 21/3212* (2013.01)

(56) References Cited

U.S. PATENT DOCUMENTS

| | | | |
|---|---|---|---|
| 2012/0129346 A1* | 5/2012 | Ryuzaki | B24B 37/044 438/693 |
| 2013/0244433 A1* | 9/2013 | Reiss | C09G 1/02 438/693 |
| 2014/0017892 A1 | 1/2014 | Ward | |

\* cited by examiner

POLISHING COMPOSITION CONTAINING CERIA ABRASIVE

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

As the size of integrated circuits is reduced and the number of integrated circuits on a chip increases, the components that make up the circuits must be positioned closer together in order to comply with the limited space available on a typical chip. Effective isolation between circuits is important for ensuring optimum semiconductor performance. To that end, shallow trenches are etched into the semiconductor substrate and filled with insulating material to isolate active regions of the integrated circuit. More specifically, shallow trench isolation (STI) is a process in which a silicon nitride layer is formed on a silicon substrate, shallow trenches are formed via etching or photolithography, and a dielectric layer is deposited to fill the trenches. Due to variation in the depth of trenches formed in this manner, it is typically necessary to deposit an excess of dielectric material on top of the substrate to ensure complete filling of all trenches. The dielectric material (e.g., a silicon oxide) conforms to the underlying topography of the substrate. Thus, the surface of the substrate is characterized by raised areas of the overlying oxide between trenches, which are referred to as pattern oxide. Pattern oxide is characterized by the step height of the excess oxide dielectric material lying outside of the trenches. The excess dielectric material is typically removed by a CMP process, which additionally provides a planar surface for further processing. As pattern oxide is abraded and planarity of the surface is approached, the oxide layer is then referred to as blanket oxide.

A polishing composition can be characterized according to its polishing rate (i.e., removal rate) and its planarization efficiency. The polishing rate refers to the rate of removal of a material from the surface of the substrate and is usually expressed in terms of units of length (thickness) per unit of time (e.g., Angstroms (Å) per minute). Planarization efficiency relates to step height reduction versus amount of material removed from the substrate. Specifically, a polishing surface, e.g., a polishing pad, first contacts the "high points" of the surface and must remove material in order to form a planar surface. A process that results in achieving a planar surface with less removal of material is considered to be more efficient than a process requiring removal of more material to achieve planarity.

Often the rate of removal of the silicon oxide pattern can be rate-limiting for the dielectric polishing step in STI processes, and therefore high removal rates of the silicon oxide pattern are desired to increase device throughput. However, if the blanket removal rate is too rapid, overpolishing of oxide in exposed trenches results in trench erosion and increased device defectivity.

A need remains for compositions and methods for chemical-mechanical polishing of silicon oxide-containing substrates that will provide useful removal rates while also providing improved planarization efficiency. The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising (a) first abrasive particles, wherein the first abrasive particles are wet-process ceria particles, have a median particle size of about 40 nm to about 100 nm, are present in the polishing composition at a concentration of about 0.005 wt. % to about 2 wt. %, and have a particle size distribution of at least about 300 nm, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a pH-adjusting agent, and (d) an aqueous carrier, wherein the pH of the polishing composition is about 1 to about 6.

The invention also provides a method of polishing a substrate comprising (i) providing a substrate, wherein the substrate comprises a silicon oxide layer; (ii) providing a polishing pad; (iii) providing a chemical-mechanical polishing composition comprising (a) first abrasive particles, wherein the first abrasive particles are wet-process ceria particles, have a median particle size of about 40 nm to about 100 nm, are present in the polishing composition at a concentration of about 0.005 wt. % to about 2 wt. %, and have a particle size distribution of at least about 300 nm, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a pH-adjusting agent, and (d) an aqueous carrier, wherein the pH of the polishing composition is about 1 to about 6; (iv) contacting the substrate with the polishing pad and the chemical-mechanical polishing composition; and (v) moving the polishing pad and the chemical-mechanical polishing composition relative to the substrate to abrade at least a portion of the silicon oxide layer on a surface of the substrate to polish the substrate.

BRIEF DESCRIPTION OF THE SEVERAL VIEWS OF THE DRAWING(S)

FIG. 1 illustrates the relative weight of the particles versus the particle size of the particles (μm) for (1) wet-process ceria particles having a median particle size of about 103 nm and a particle size distribution of about 200 nm (i.e., comparative ceria particles included in Polishing Composition 1A), (2) a mixture of wet-process ceria particles having a median particle size about 54 nm and wet-process ceria particles having a median particle size of about 103 nm, wherein the mixture of ceria particles has a particle size distribution of about 200 nm (i.e., comparative ceria particles included in Polishing Composition 1B), and (3) wet-process ceria particles having a median particle size of about 73 nm and a particle size distribution of about 380 nm (i.e., first abrasive particles according to the invention included in Polishing Composition 1C).

Figure 2:
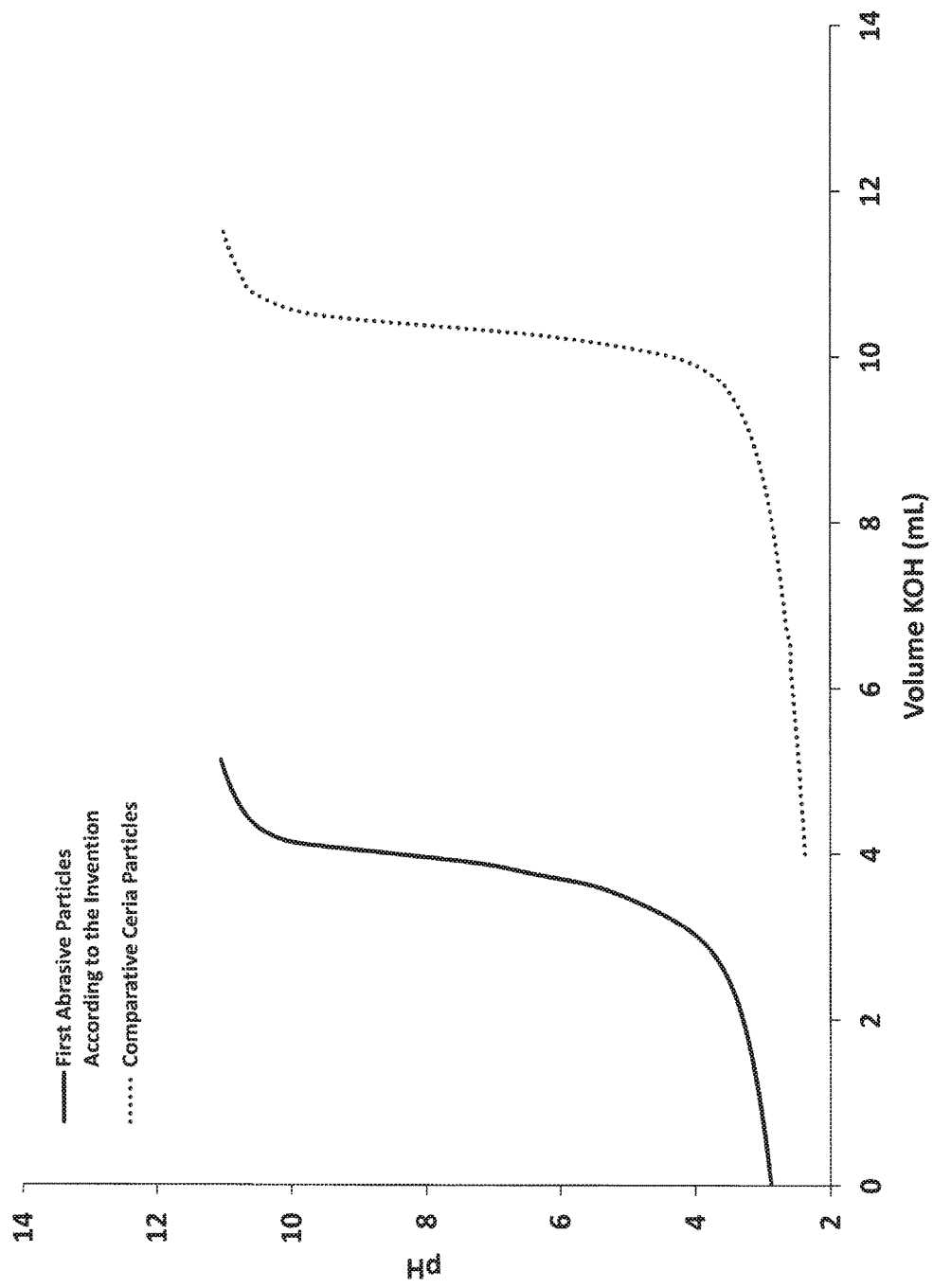

FIG. 2 plots pH versus volume of KOH (mL) to illustrate the titration curve of an embodiment of first abrasive particles according to the invention, i.e., wet-process ceria particles having a median particle size of about 73 nm and having a particle size distribution of about 380 nm, as well as the titration curve of comparative wet-process ceria particles having a median particle size of about 103 nm and a particle size distribution of about 200 nm.

Figure 3:
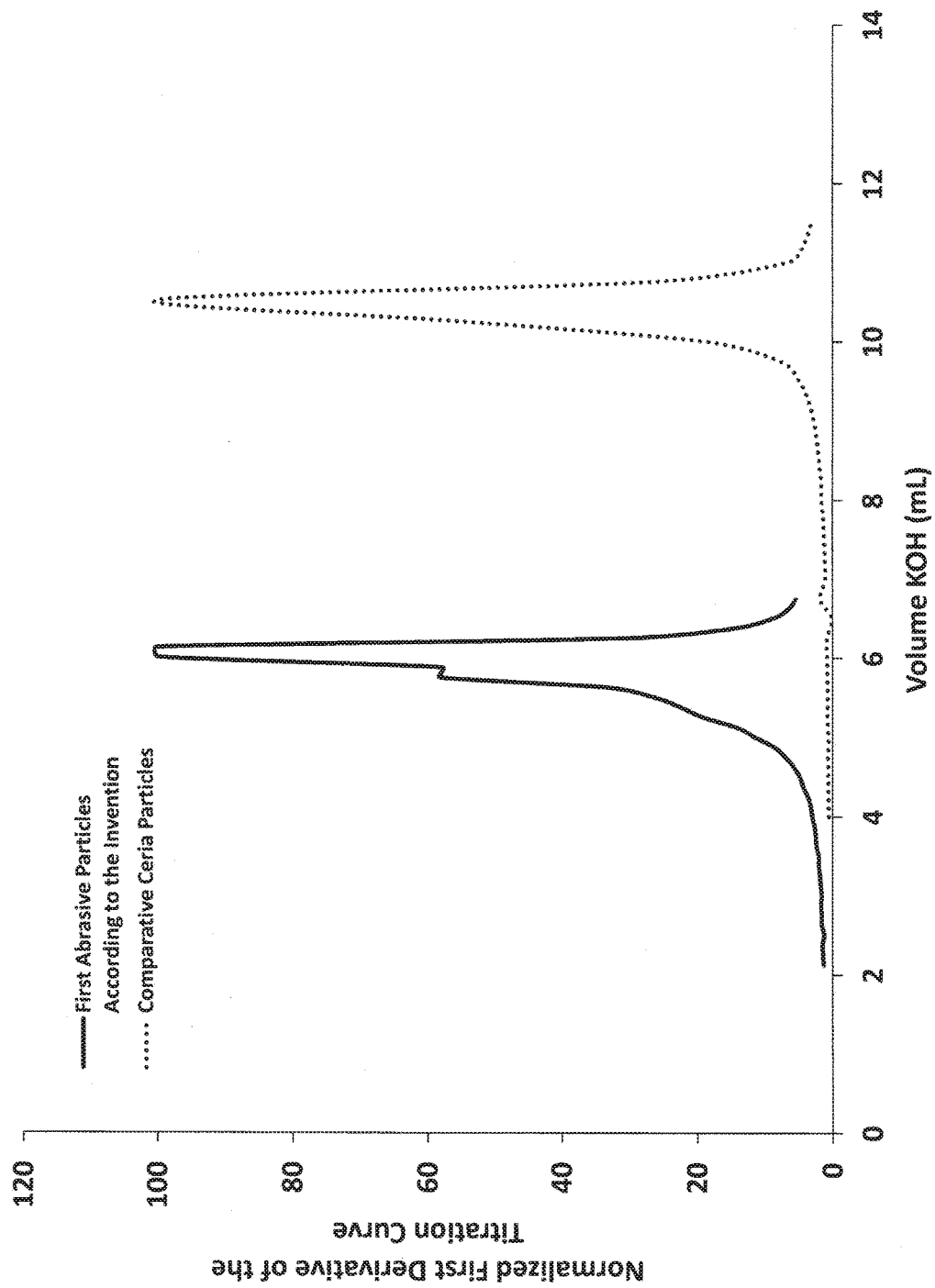

FIG. 3 illustrates the normalized first derivative of the titration curve for an embodiment of first abrasive particles according to the invention, i.e., wet-process ceria particles having a median particle size of about 73 nm and a particle size distribution of about 380 nm, as well as for comparative wet-process ceria particles having a median particle size of about 103 nm and a particle size distribution of about 200 nm.

Figure 4:
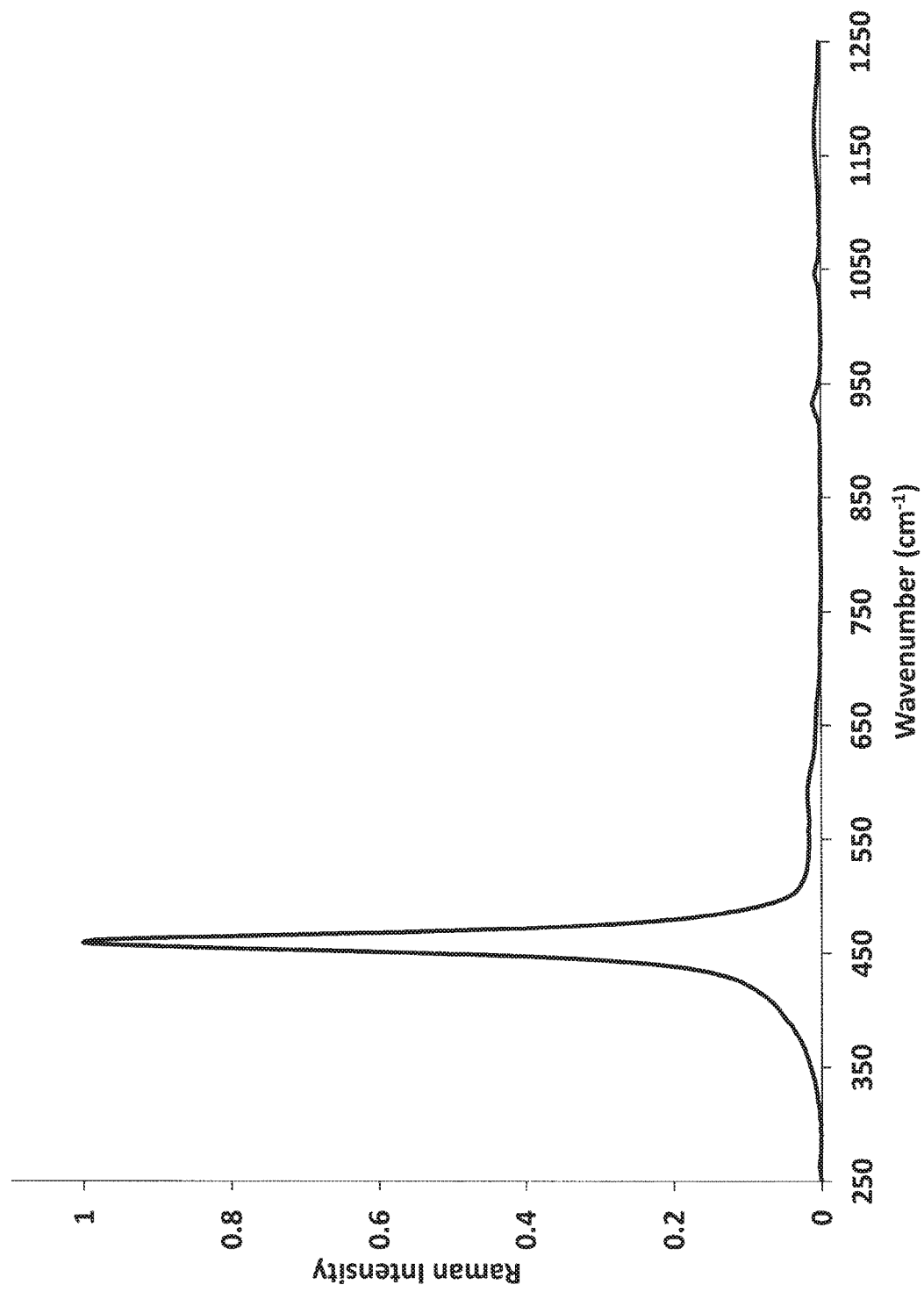

FIG. 4 illustrates the Raman intensity versus wavenumber ($cm^{-1}$) for a Raman spectrum of an embodiment of first abrasive particles according to the invention, i.e., wet-process ceria particles having a median particle size of about 73 nm and a particle size distribution of about 380 nm.

Figure 5:
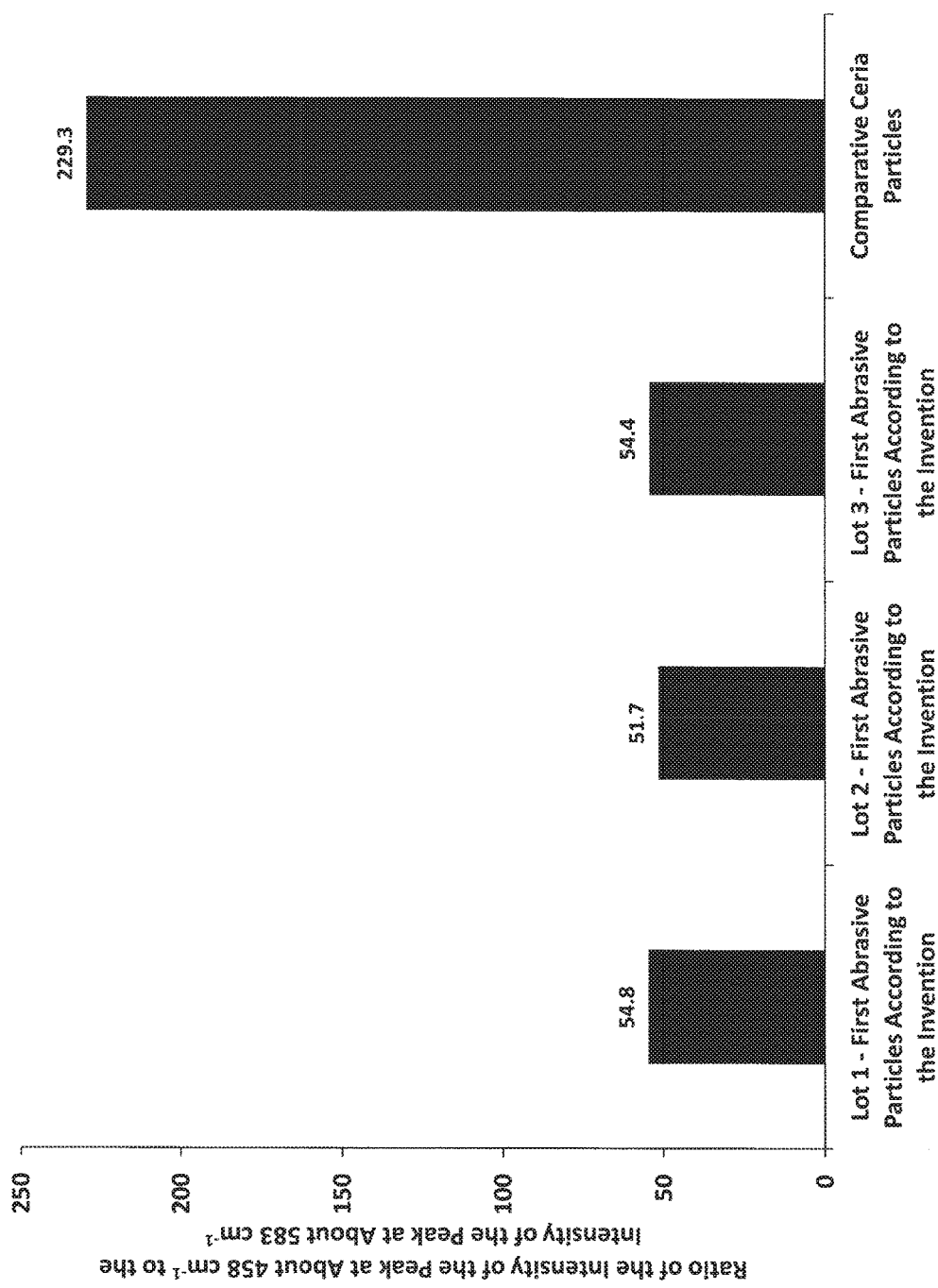

FIG. 5 illustrates the ratio of the intensity of the peak at about 458 $cm^{-1}$ to the intensity of the peak at about 583 $cm^{-1}$ on the Raman spectra of three lots of an embodiment of first abrasive particles according to the invention, i.e., three lots of wet-process ceria particles having a median particle size of about 73 nm and having a particle size distribution of about 380 nm, as well as the ratio of the intensity of the peak at about 458 $cm^{-1}$ to the intensity of the peak at about 583 $cm^{-1}$ on the Raman spectrum of one lot of comparative wet-process ceria particles having a median particle size of about 103 nm and a particle size distribution of about 200 nm.

Figure 6:
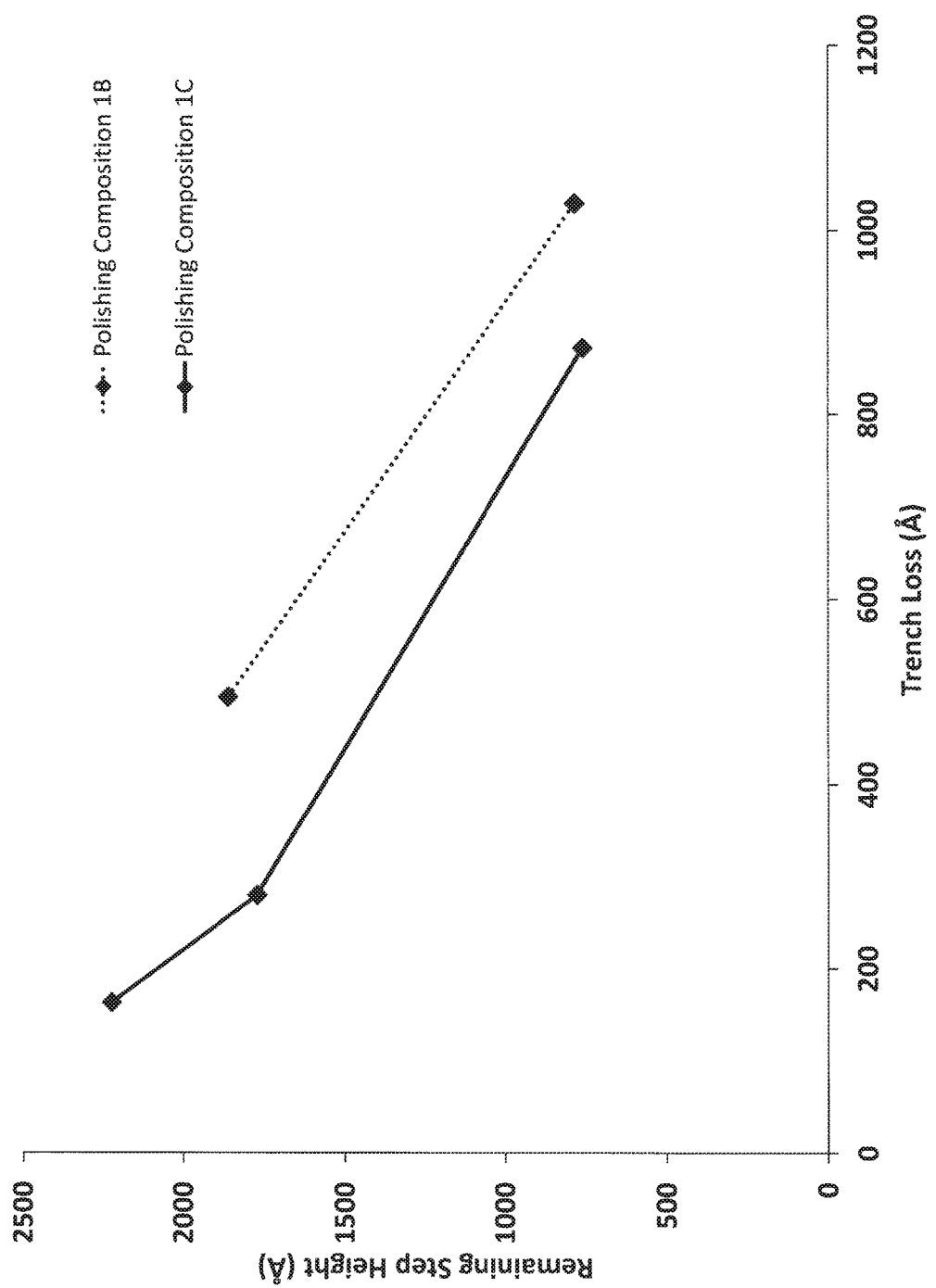

FIG. 6 illustrates the remaining step height (Å) versus trench loss (Å) for a polishing composition comprising a mixture of wet-process ceria particles having a median particle size about 54 nm and wet-process ceria particles having a median particle size of about 103 nm, wherein the mixture of wet-process ceria particles has a particle size distribution of about 200 nm (i.e., comparative ceria particles included in Polishing Composition 1B), as well as for a polishing composition comprising wet-process ceria particles having a median particle size of about 73 nm and a particle size distribution of about 380 nm (i.e., first abrasive particles according to the invention included in Polishing Composition 1C).

DETAILED DESCRIPTION OF THE INVENTION

The invention provides a chemical-mechanical polishing composition comprising, consisting essentially of, or consisting of (a) first abrasive particles, wherein the first abrasive particles are wet-process ceria particles, have a median particle size of about 40 nm to about 100 nm, are present in the polishing composition at a concentration of about 0.005 wt. % to about 2 wt. %, and have a particle size distribution of at least about 300 nm, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a pH-adjusting agent, and (d) an aqueous carrier, wherein the pH of the polishing composition is about 1 to about 6.

The polishing composition comprises first abrasive particles. The first abrasive particles are wet-process ceria particles. For example, the first abrasive particles can be precipitated ceria particles or condensation-polymerized ceria particles, including colloidal ceria particles.

The first abrasive particles can be made by any suitable process. As an example, the first abrasive particles can be wet-process ceria particles made according to the following process. Typically, the first step in synthesizing wet-process ceria particles according to the invention is to dissolve a ceria precursor in water. The ceria precursor can be any suitable ceria precursor, and can include a ceria salt having any suitable charge, e.g., $Ce^{3+}$ or $Ce^{4+}$. Suitable ceria precursors include, for example, cerium III nitrate, cerium IV ammonium nitrate, cerium III carbonate, cerium IV sulfate, and cerium III chloride. Preferably, the ceria precursor is cerium III nitrate.

The pH of the ceria precursor solution typically is increased to form amorphous $Ce(OH)_3$. The pH of the solution can be increased to any suitable pH. For example, the pH of the solution can be increased to a pH of about 10 or more, e.g., a pH of about 10.5 or more, a pH of about 11 or more, or a pH of about 12 or more. Typically, the solution will have a pH of about 14 or less, e.g., a pH of about 13.5 or less, or a pH of about 13 or less. Any suitable base can be used to increase the pH of the solution. Suitable bases include, for example, KOH, NaOH, $NH_4OH$, and tetramethylammonium hydroxide. Organic bases such as, for example, ethanolamine and diethanolamine, also are suitable. The solution will become white and cloudy as the pH increases and amorphous $Ce(OH)_3$ is formed.

The ceria precursor solution typically is mixed for several hours. For example, the solution can be mixed for about 1 hour or more, e.g., about 2 hours or more, about 4 hours or more, about 6 hours or more, about 8 hours or more, about 12 hours or more, about 16 hours or more, about 20 hours or more, or about 24 hours or more. Typically, the solution is mixed for about 1 hour to about 24 hours, e.g., about 2 hours, about 8 hours, or about 12 hours. When mixing is complete, the solution can be transferred to a pressurized vessel and heated.

The ceria precursor solution can be heated to any suitable temperature. For example, the solution can be heated to a temperature of about 50° C. or more, e.g., about 75° C. or more, about 100° C. or more, about 125° C. or more, about 150° C. or more, about 175° C. or more, or about 200° C. or more. Alternatively, or in addition, the solution can be heated to a temperature of about 500° C. or less, e.g., about 450° C. or less, about 400° C. or less, about 375° C. or less, about 350° C. or less, about 300° C. or less, about 250° C. or less, about 225° C., or about 200° C. or less. Thus, the solution can be heated to a temperature within a range bounded by any two of the aforementioned endpoints. For example, the solution can be heated to a temperature of about 50° C. to about 300° C., e.g., about 50° C. to about 275° C., about 50° C. to about 250° C., about 50° C. to about 200° C., about 75° C. to about 300° C., about 75° C. to about 250° C., about 75° C. to about 200° C., about 100° C. to about 300° C., about 100° C. to about 250° C., or about 100° C. to about 225° C.

The ceria precursor solution typically is heated for several hours. For example, the solution can be heated for about 1 hour or more, e.g., about 5 hours or more, about 10 hours or more, about 25 hours or more, about 50 hours or more, about 75 hours or more, about 100 hours or more, or about 110 hours or more. Alternatively, or in addition, the solution can be heated for about 200 hours or less, e.g., about 180 hours or less, about 165 hours or less, about 150 hours or less, about 125 hours or less, about 115 hours or less, or about 100 hours or less. Thus, the solution can be heated for a time period bounded by any two of the aforementioned endpoints. For example, the solution can be heated for about 1 hour to about 150 hours, e.g., about 5 hours to about 130 hours, about 10 hours to about 120 hours, about 15 hours to about 115 hours, or about 25 hours to about 100 hours.

After heating, the ceria precursor solution can be filtered to separate the precipitated ceria particles. The precipitant can be rinsed with excess water to remove unreacted ceria precursor. The mixture of precipitant and excess water can be filtered following each rinse step to remove impurities. Once adequately rinsed, the ceria particles can be dried for additional processing, e.g., sintering, or the ceria particles can be directly redispersed.

The ceria particles optionally can be dried and sintered prior to redispersion. The terms "sintering" and "calcining" are used interchangeably herein to refer to the heating of the ceria particles under the conditions described below. Sintering the ceria particles impacts their resulting crystallinity. Without wishing to be bound by any particular theory, it is believed that sintering the ceria particles at high temperatures and for extended periods of time reduces defects in the crystal lattice structure of the particles. Any suitable method can be used to sinter the ceria particles. As an example, the ceria particles can be dried, and then can be sintered at an elevated temperature. Drying can be carried out at room temperature, or at an elevated temperature. In particular, drying can be carried out at a temperature of about 20° C. to about 40° C., e.g., about 25° C., about 30° C., or about 35° C. Alternatively, or in addition, drying can be carried out at an elevated temperature of about 80° C. to about 150° C., e.g., about 85° C., about 100° C., about 115° C., about 125° C., or about 140° C. After the ceria particles have been dried, they can be ground to create a powder. Grinding can be carried out using any suitable grinding material, such as zirconia.

The ceria particles can be sintered in any suitable oven, and at any suitable temperature. For example, the ceria particles can be sintered at a temperature of about 200° C. or more, e.g., about 215° C. or more, about 225° C. or more, about 250° C. or more, about 275° C. or more, about 300° C. or more, about 350° C. or more, or about 375° C. or more. Alternatively, or in addition, the ceria particles can be sintered at a temperature of about 1000° C. or less, e.g., about 900° C. or less, about 750° C. or less, about 650° C. or less, about 550° C. or less, about 500° C. or less, about 450° C. or less, or about 400° C. or less. Thus, the ceria particles can be sintered at a temperature bounded by any two of the aforementioned endpoints. For example, the ceria particles can be sintered at a temperature of about 200° C. to about 1000° C., e.g., about 250° C. to about 800° C., about 300° C. to about 700° C., about 325° C. to about 650° C., about 350° C. to about 600° C., about 350° C. to about 550° C., about 400° C. to about 550° C., about 450° C. to about 800° C., about 500° C. to about 1000° C., or about 500° C. to about 800° C.

The ceria particles can be sintered for any suitable length of time. For example, the ceria particles can be sintered for about 1 hour or more, e.g., about 2 hours or more, about 5 hours or more, or about 8 hours or more. Alternatively, or in addition, the ceria particles can be sintered for about 20 hours or less, e.g., about 18 hours or less, about 15 hours or less, about 12 hours or less, or about 10 hours or less. Thus, the ceria particles can be sintered for a time period bounded by any two of the aforementioned endpoints. For example, the ceria particles can be sintered for about 1 hour to about 20 hours, e.g., about 1 hour to about 15 hours, about 1 hour to about 10 hours, about 1 hour to about 5 hours, about 5 hours to about 20 hours, or about 10 hours to about 20 hours.

The ceria particles also can be sintered at various temperatures and for various lengths of time within the ranges described above. For example, the ceria particles can be sintered in a zone furnace, which exposes the ceria particles to one or more temperatures for various lengths of time. As an example, the ceria particles can be sintered at a temperature of about 200° C. to about 1000° C. for about 1 hour or more, and then can be sintered at a different temperature that is within the range of about 200° C. to about 1000° C. for about 1 hour or more.

The ceria particles typically are redispersed in a suitable carrier, e.g., an aqueous carrier, particularly water. If the ceria particles are sintered, then the ceria particles are redispersed after the completion of sintering. Any suitable process can be used to redisperse the ceria particles. Typically, the ceria particles are redispersed by lowering the pH of a mixture of the ceria particles and water using a suitable acid. As the pH is lowered, the surface of the ceria particles develops a cationic zeta potential. This cationic zeta potential creates repulsion forces between the ceria particles, which facilitates their redispersion. Any suitable acid can be used to lower the pH of the mixture. Suitable acids include, for example hydrochloric acid and nitric acid. Organic acids which are highly water-soluble and have hydrophilic functional groups also are suitable. Suitable organic acids include, for example, acetic acid. Acids with multivalent anions, such as $H_3PO_4$ and $H_2SO_4$, generally are not preferred. The pH of the mixture can be lowered to any suitable pH. For example, the pH of the mixture can be lowered to about 2 to about 5, e.g., about 2.5, about 3, about 3.5, about 4, or about 4.5. Typically, the pH of the mixture is not lowered to less than about 2.

The redispersed ceria particles typically are milled to reduce their particle size. Preferably, the ceria particles are milled simultaneously with redispersion. Milling can be carried out using any suitable milling material, such as zirconia. Milling also can be carried out using sonication or wet-jet procedures. After milling, the ceria particles can be filtered to remove any remaining large particles. For example, the ceria particles can be filtered using a filter having a pore size of about 0.3 μm or more, e.g., about 0.4 μm or more, or about 0.5 μm or more.

The first abrasive particles have a median particle size of about 40 nm to about 100 nm. The particle size of a particle is the diameter of the smallest sphere that encompasses the particle. The particle size of the first abrasive particles can be measured using any suitable technique. For example, the particle size of the first abrasive particles can be measured using a disc centrifuge, i.e., by differential centrifugal sedimentation (DCS). Suitable disc centrifuge particle size measurement instruments are commercially available, such as from CPS Instruments (Prairieville, La.), e.g., CPS Disc Centrifuge Model DC24000UHR. Unless specified otherwise, the median particle size values reported and claimed herein are based on disc centrifuge measurements.

For example, the first abrasive particles can have a median particle size of about 40 nm or more, e.g., about 45 nm or more, about 50 nm or more, about 55 nm or more, about 60 nm or more, about 65 nm or more, about 70 nm or more, about 75 nm or more, or about 80 nm or more. Alternatively, or in addition, the first abrasive particles can have a median particle size of about 100 nm or less, e.g., about 95 nm or less, about 90 nm or less, about 85 nm or less, about 80 nm or less, about 75 nm or less, about 70 nm or less, or about 65 nm or less. Thus, the first abrasive particles can have a median particle size within a range bounded by any two of the aforementioned endpoints. For example, the first abrasive particles can have a median particle size of about 40 nm to about 100 nm, e.g., about 40 nm to about 80 nm, about 40 nm to about 75 nm, about 40 nm to about 60 nm, about 50 nm to about 100 nm, about 50 nm to about 80 nm, about 50 nm to about 75 nm, about 50 nm to about 70 nm, about 60 nm to about 100 nm, about 60 nm to about 80 nm, about 60 nm to about 85 nm, or about 65 nm to about 75 nm. Preferably, the first abrasive particles have a median particle size of about 60 nm to about 80 nm, e.g., a median particle size of about 65 nm, a median particle size of about 70 nm, or a median particle size of about 75 nm.

The first abrasive particles are present in the polishing composition at a concentration of about 0.005 wt. % to about 2 wt. %. For example, the first abrasive particles can be present in the polishing composition at a concentration of about 0.005 wt. % or more, e.g., about 0.0075 wt. % or more, about 0.01 wt. % or more, about 0.025 wt. % or more, about 0.05 wt. % or more, about 0.075 wt. % or more, about 0.1 wt. % or more, or about 0.25 wt. % or more. Alternatively, or in addition, the first abrasive particles can be present in the polishing composition at a concentration of about 2 wt. % or less, e.g., about 1.75 wt. % or less, about 1.5 wt. % or less, about 1.25 wt. % or less, about 1 wt. % or less, about 0.75 wt. % or less, about 0.5 wt. % or less, or about 0.25 wt. % or less. Thus, the first abrasive particles can be present in the polishing composition a concentration within a range bounded by any two of the aforementioned endpoints. For example, the first abrasive particles can be present in the polishing composition at a concentration of about 0.005 wt. % to about 2 wt. %, e.g., about 0.005 wt. % to about 1.75 wt. %, about 0.005 wt. % to about 1.5 wt. %, about 0.005 wt. % to about 1.25 wt. %, about 0.005 wt. % to about 1 wt. %, about 0.01 wt. % to about 2 wt. %, about 0.01 wt. % to about 1.5 wt. %, about 0.05 wt. % to about 2 wt. %, about 0.05 wt. % to about 1.5 wt. %, about 0.1 wt. % to about 2 wt. %, about 0.1 wt. % to about 1.5 wt. %, or about 0.1 wt. % to about 1 wt. %.

Preferably, the first abrasive particles are present in the polishing composition at a concentration of about 0.1 wt. % to about 0.5 wt. %, e.g., about 0.15 wt. % to about 0.4 wt. %, about 0.15 wt. % to about 0.35 wt. %, or about 0.2 wt. % to about 0.3 wt. %. More preferably, the first abrasive particles are present in the polishing composition at a concentration of about 0.1 wt. % to about 0.3 wt. %, e.g., about 0.1 wt. %, about 0.15 wt. %, about 0.2 wt. %, about 0.25 wt. %, about 0.28 wt. %, or about 0.29 wt. %.

The first abrasive particles have a particle size distribution of at least about 300 nm. The particle size distribution refers to the difference between the particle size of the largest particle and the particle size of the smallest particle. For example, the first abrasive particles can have a particle size distribution of at least about 315 nm, e.g., at least about 320 nm, at least about 325 nm, at least about 330 nm, at least about 340 nm, at least about 350 nm, at least about 355 nm, at least about 360 nm, at least about 365 nm, at least about 370 nm, at least about 375 nm, or at least about 380 nm. Preferably, the first abrasive particles have a particle size distribution of at least about 320 nm, e.g., at least about 325 nm, at least about 335 nm, or at least about 350 nm. Typically, the first abrasive particles will have a particle size distribution of about 500 nm or less, e.g., about 475 nm or less, about 450 nm or less, about 425 nm or less, or about 415 nm or less. Thus, the first abrasive particles can have a particle size distribution within a range bounded by any two of the aforementioned endpoints. For example, the first abrasive particles can have a particle size distribution of about 315 nm to about 500 nm, e.g., about 320 nm to about 480 nm, about 325 nm to about 475 nm, about 335 nm to about 460 nm, or about 340 nm to about 450 nm.

The first abrasive particles can have any suitable largest particle size and any suitable smallest particle size, as long as the particle size distribution of the first abrasive particles is at least about 300 nm.

For example, the first abrasive particles can have a smallest particle size of about 1 nm to about 50 nm, e.g., about 1 nm to about 40 nm, about 1 nm to about 30 nm, about 1 nm to about 25 nm, about 1 nm to about 20 nm, about 5 nm to about 25 nm, or about 10 nm to about 25 nm. Preferably, the first abrasive particles have a smallest particle size of about 10 nm to about 30 nm, e.g., about 15 nm, about 20 nm, or about 25 nm.

The first abrasive particles can have a largest particle size of about 250 nm to about 500 nm, e.g., about 250 nm to about 450 nm, about 250 nm to about 400 nm, about 300 nm to about 500 nm, or about 300 nm to about 400 nm. Preferably, the first abrasive particles have a largest particle size of about 350 nm to about 450 nm, e.g., about 375 nm, about 400 nm, or about 425 nm.

Ceria particles have three predominant types of hydroxyl groups on their surfaces, as follows:

TABLE 1

Characterization of Hydroxyl Groups Present on the Surface of Ceria Particles

| Hydroxyl Group Type | Abbreviation | $pK_a$ |
|---|---|---|
| Monodentate | Ce—OH | 24 |
| Bidentate | $Ce_2$—OH | 14.8 |
| Tridentate | $Ce_3$—OH | 5.5 |

As shown in Table 1, the hydroxyl groups on the surface of the ceria particles have different $pK_a$ values. As a result of their different $pK_a$ values, the hydroxyl groups have different reactivities. Without wishing to be bound by any particular theory, it is believed that ceria particles contain predominately bidentate hydroxyl groups on their surfaces, but that ceria particles containing increased tridentate content provide higher removal rates in chemical-mechanical polishing compositions. Thus, it is believed that optimizing the amount of tridentate hydroxyl groups on the surface of the ceria particles can improve polishing performance.

Because of the low pKa value of the tridentate hydroxyl groups, acid/base titration can be used to approximate the amount of tridentate hydroxyl groups present on the surface of ceria particles. In particular, ceria particles can be adjusted to an acidic pH with a suitable acid, and then titrated with a suitable base. For example, ceria particles can be adjusted to a pH of less than about 4, e.g., a pH of about 3.5, a pH of about 3, a pH of about 2.5, or a pH of about 2, with a suitable acid, e.g., $HClO_4$, HCl, or $HNO_3$, and then titrated with a suitable base, e.g., KOH, NaOH, or $NH_4OH$. If the ceria particles include tridentate hydroxyl groups on the surface of the particles, the normalized first derivative of the titration curve will include two peaks: a peak shoulder just below pH 6, and a dominant peak for the deprotonation of water at approximately pH 7. The peak shoulder just below pH 6 corresponds to the tridentate hydroxyl groups present on the surface of the ceria particles. The area of the peak shoulder can be calculated and used to determine the amount of base, e.g., KOH, NaOH, or $NH_4OH$, that reacted with the particles. The amount of tridentate hydroxyl groups can be calculated by assuming a 1:1 correspondence between the amount of base that reacted with the ceria particles and the amount of tridentate hydroxyl groups present on the surface of the ceria particles. The amount of tridentate hydroxyl groups can be divided by the BET surface area of the ceria particles to calculate the surface coverage of tridentate hydroxyl groups present on the surface of the ceria particles.

Preferably, the first abrasive particles have a surface that comprises tridentate hydroxyl groups. For example, the first abrasive particles can have a surface coverage of tridentate hydroxyl groups that is about $2.0 \times 10^{-5}$ moles/$m^2$ or more, e.g., about $2.1 \times 10^{-5}$ moles/$m^2$ or more, about $2.2 \times 10^{-5}$ moles/$m^2$ or more, about $2.3 \times 10^{-5}$ moles/$m^2$ or more, about $2.4 \times 10^{-5}$ moles/$m^2$ or more, about $2.5 \times 10^{-5}$ moles/$m^2$ or more, about $2.75 \times 10^{-5}$ moles/$m^2$ or more, about $3.0 \times 10^{-5}$ moles/$m^2$ or more, or about $3.25 \times 10^{-5}$ moles/$m^2$ or more. Alternatively, or in addition, the first abrasive particles can have a surface coverage of tridentate hydroxyl groups that is about $6.0 \times 10^{-5}$ moles/$m^2$ or less, e.g., about $5.5 \times 10^{-5}$ moles/$m^2$ or less, about $5.0 \times 10^{-5}$ moles/$m^2$ or less, about $4.5 \times 10^{-5}$ moles/$m^2$ or less, about $4.0 \times 10^{-5}$ moles/$m^2$ or less, about $3.5 \times 10^{-5}$ moles/$m^2$ or less, about $3.0 \times 10^{-5}$ moles/$m^2$ or less, about $2.75 \times 10^{-5}$ moles/$m^2$ or less, or about 2.5 moles/$m^2$ or less. Thus, the first abrasive particles can have a surface coverage of tridentate hydroxyl groups within a range bounded by any two of the aforementioned endpoints. For example, the first abrasive particles can have a surface coverage of tridentate hydroxyl groups that is between about $2.0 \times 10^{-5}$ moles/$m^2$ and about $6 \times 10^{-5}$ moles/$m^2$, e.g., about $2.2 \times 10^{-5}$ moles/$m^2$ to about $5.0 \times 10^{-5}$ moles/$m^2$, about $2.2 \times 10^{-5}$ moles/$m^2$ to about $4.0 \times 10^{-5}$ moles/$m^2$, about $2.3 \times 10^{-5}$ moles/$m^2$ to about $3.0 \times 10^{-5}$ moles/$m^2$, about $2.5 \times 10^{-5}$ moles/$m^2$ to about $3.75 \times 10^{-5}$ moles/$m^2$, or about $2.75 \times 10^{-5}$ moles/$m^2$ to about $4.0 \times 10^{-5}$ moles/$m^2$.

The first abrasive particles also preferably have defects on the surface of the particles. Without wishing to be bound by any particular theory, it is believed that milling ceria particles can result in defects on the surface of the ceria particles, which defects also impact the performance of ceria particles in chemical-mechanical polishing compositions. In particular, ceria particles can be fractured as they are milled, which can expose less favored surface states. This process, known as relaxation, results in atoms near the surface of the ceria particles that have a limited ability to reorganize and return to a more favored state, leading to the formation of defects on the particle surface.

Raman spectroscopy can be used to quantitate the amount of defects present on the surface of particles. In particular, ceria particles can be centrifuged, the supernatant can be removed, and the ceria particles can be dried overnight at 60° C. A Raman spectrum can be collected on the dry powder using a suitable laser. For example, a Raman spectrum can be collected on the dry powder using a 532 nm laser. The most dominant peak on the Raman spectrum will be present at about 458 $cm^{-1}$, corresponding to the Ce—O vibration. A series of much smaller peaks after the peak at about 458 $cm^{-1}$ (e.g., peaks at 583 $cm^{-1}$, 660 $cm^{-1}$, and 1159 $cm^{-1}$) are sensitive to surface defectivity and will increase in intensity as defects on the surface of the ceria particles increase. The amount of surface defectivity can be approximated by dividing the intensity of the peak at about 458 $cm^{-1}$ by the intensity of the peak at about 583 $cm^{-1}$. As the amount of surface defects increases, the ratio between the intensity of the peak at about 458 $cm^{-1}$ and the intensity of the peak at about 583 $cm^{-1}$ becomes smaller. Unless specified otherwise, the Raman spectra used to calculate the ratios of the intensity of the peak at about 458 $cm^{-1}$ to the intensity of the peak at about 583 $cm^{-1}$ that are reported and claimed herein are generated using a 532 nm laser.

Preferably, a Raman spectrum of the first abrasive particles comprises a peak at about 458 $cm^{-1}$ and a peak at about 583 $cm^{-1}$, wherein the ratio of the intensity of the peak at about 458 $cm^{-1}$ to the intensity of the peak at about 583 $cm^{-1}$ is about 100 or less, e.g., about 90 or less, about 80 or less, about 75 or less, about 65 or less, or about 55 or less. More preferably, the ratio of the intensity of the peak at about 458 $cm^{-1}$ to the intensity of the peak at about 583 $cm^{-1}$ is about 60 or less, e.g., about 59 or less, about 58 or less, about 57 or less, about 56 or less, or about 55 or less. Alternatively, or in addition, the ratio of the intensity of the peak at about 458 $cm^{-1}$ to the intensity of the peak at about 583 $cm^{-1}$ can be about 2 or more, e.g., about 5 or more, about 7 or more, about 10 or more, about 12 or more, about 15 or more, about 20 or more, about 25 or more, or about 30 or more. Thus, the ratio of the intensity of the peak at about 458 $cm^{-1}$ to the intensity of the peak at about 583 $cm^{-1}$ can be any number within a range bounded by any two of the aforementioned endpoints. For example, the ratio of the intensity of the peak at about 458 $cm^{-1}$ to the intensity of the peak at about 583 $cm^{-1}$ can be about 2 to about 100, e.g., about 4 to about 90, about 6 to about 80, about 10 to about 60, about 25 to about 58, about 30 to about 56, or about 30 to about 55.

First abrasive particles made according to the process described herein can be screened according to the methods described above to identify first abrasive particles having the preferred surface chemistry described herein, e.g., first abrasive particles having a median particle size of about 40 nm to about 100 nm and a particle size distribution of at least about 300 nm, wherein the first abrasive particles have a surface that comprises tridentate hydroxyl groups, and wherein the first abrasive particles have a surface coverage of tridentate hydroxyl groups that is about $2.0 \times 10^{-5}$ moles/$m^2$ or more, and/or first abrasive particles having a median particle size of about 40 nm to about 100 nm and a particle size distribution of at least about 300 nm, wherein a Raman spectrum of the first abrasive particles comprises a peak at about 458 $cm^{-1}$ and a peak at about 583 $cm^{-1}$, and wherein the ratio of the intensity of the peak at about 458 cm$^{-1}$ to the intensity of the peak at about 583 cm$^{-1}$ is about 100 or less. The polishing compositions described herein preferably comprise first abrasive particles made according to the process described herein and having the preferred surface chemistry described herein.

The polishing composition optionally can comprise additional abrasive particles (e.g., second abrasive particles, third abrasive particles, etc.). The additional abrasive particles can be, for example, metal oxide abrasive particles of a different metal than the first abrasive particles, such as metal oxide abrasive particles of zirconia (e.g., zirconium oxide), titania (e.g., titanium dioxide), germania (e.g., germanium dioxide, germanium oxide), magnesia (e.g., magnesium oxide), nickel oxide, co-formed products thereof, or combinations thereof. The additional abrasive particles also can be organic particles of gelatin, latex, cellulose, polystyrene, or polyacrylate. Alternatively, the polishing composition can comprise first abrasive particles that are wet-process ceria particles having a median particle size of about 40 nm to about 100 nm and a particle size distribution of at least about 300 nm, wherein the polishing composition does not include any additional abrasive particles.

The additional abrasive particles also can be metal oxide abrasive particles of ceria (e.g., cerium oxide) that are a different type of ceria than the first abrasive particles, i.e., ceria particles that are not wet-process ceria particles, such as fumed ceria particles. Alternatively, the polishing composition can comprise first abrasive particles that are wet-process ceria particles having a median particle size of about 40 nm to about 100 nm and a particle size distribution of at least about 300 nm, wherein the polishing composition does not include any additional ceria particles.

The additional abrasive particles also can be wet-process ceria particles that have different surface chemistry than the preferred surface chemistry of the first abrasive particles described herein, e.g., wet-process ceria particles that have a surface that does not comprise tridentate hydroxyl groups; wet-process ceria particles that have a surface that comprises tridentate hydroxyl groups, wherein the wet-process ceria particles have a surface coverage of tridentate hydroxyl groups that is less than about 2.3×10$^{-5}$ moles/m$^2$; wet-process ceria particles, wherein a Raman spectrum of the wet-process ceria particles does not comprise a peak at about 583 cm$^{-1}$; or wet-process ceria particles, wherein a Raman spectrum of the wet-process ceria particles comprises a peak at about 458 cm$^{-1}$ and a peak at about 583 cm$^{-1}$, and wherein the ratio of the intensity of the peak at about 458 cm$^{-1}$ to the intensity of the peak at about 583 cm$^{-1}$ is greater than about 100.

Alternatively, the polishing composition can comprise first abrasive particles that are wet-process ceria particles having a median particle size of about 40 nm to about 100 nm and a particle size distribution of at least about 300 nm, and having the preferred surface chemistry described herein, wherein the polishing composition does not include any additional wet-process ceria particles. For example, the polishing composition can comprise first abrasive particles that are wet-process ceria particles having a median particle size of about 40 nm to about 100 nm and a particle size distribution of at least about 300 nm, wherein the first abrasive particles have a surface that comprises tridentate hydroxyl groups, wherein the first abrasive particles have a surface coverage of tridentate hydroxyl groups that is about 2.3×10$^{-5}$ moles/m$^2$ or more, and wherein the polishing composition does not include any additional wet-process ceria particles. The polishing composition also can comprise first abrasive particles that are wet-process ceria particles having a median particle size of about 40 nm to about 100 nm and a particle size distribution of at least about 300 nm, wherein a Raman spectrum of the first abrasive particles comprises a peak at about 458 cm$^{-1}$ and a peak at about 583 cm$^{-1}$, wherein the ratio of the intensity of the peak at about 458 cm$^{-1}$ to the intensity of the peak at about 583 cm$^{-1}$ is about 100 or less, and wherein the polishing composition does not include any additional wet-process ceria particles.

Desirably, the polishing composition can comprise first abrasive particles that are wet-process ceria particles having a median particle size of about 40 nm to about 100 nm and a particle size distribution of at least about 300 nm, wherein the polishing composition does not include any additional wet-process ceria particles.

When the polishing composition includes additional abrasive particles (e.g., second abrasive particles, third abrasive particles, etc.), the additional abrasive particles can have any suitable median particle size. For example, the polishing composition can include second abrasive particles, and the second abrasive particles can have a median particle size of about 1 nm to about 60 nm, e.g., about 1 nm to about 55 nm, about 1 nm to about 50 nm, about 1 nm to about 40 nm, about 1 nm to about 35 nm, about 1 nm to about 30 nm, about 1 nm to about 25 nm, about 1 nm to about 20 nm, about 5 nm to about 50 nm, about 5 nm to about 35 nm, or about 15 nm to about 30 nm. Alternatively, the second abrasive particles can have a median particle size of about 100 nm to about 350 nm, e.g., about 100 nm to about 300 nm, about 105 nm to about 350 nm, about 115 nm to about 350 nm, about 135 nm to about 325 nm, about 150 nm to about 315 nm, about 175 nm to about 300 nm, about 200 nm to about 275 nm, or about 225 nm to about 250 nm. Preferably, the additional abrasive particles (e.g., second abrasive particles, third abrasive particles, etc.) have a median particle size of about 1 nm to about 35 nm, or a median particle size of about 125 nm to about 300 nm.

The additional abrasive particles (i.e., the second abrasive particles, third abrasive particles, etc., in total) can be present in the polishing composition at any suitable concentration. Preferably, the additional abrasive particles are present in the polishing composition at a concentration of about 0.005 wt. % to about 2 wt. %. For example, the additional abrasive particles can be present in the polishing composition at a concentration of about 0.005 wt. % or more, e.g., about 0.0075 wt. % or more, about 0.01 wt. % or more, about 0.025 wt. % or more, about 0.05 wt. % or more, about 0.075 wt. % or more, about 0.1 wt. % or more, or about 0.25 wt. % or more. Alternatively, or in addition, the additional abrasive particles can be present in the polishing composition at a concentration of about 2 wt. % or less, e.g., about 1.75 wt. % or less, about 1.5 wt. % or less, about 1.25 wt. % or less, about 1 wt. % or less, about 0.75 wt. % or less, about 0.5 wt. % or less, or about 0.25 wt. % or less. Thus, the additional abrasive particles can be present in the polishing composition at a concentration within a range bounded by any two of the aforementioned endpoints. For example, the polishing composition can include second abrasive particles, and the second abrasive particles can be present in the polishing composition at a concentration of about 0.005 wt. % to about 2 wt. %, e.g., about 0.005 wt. % to about 1.75 wt. %, about 0.005 wt. % to about 1.5 wt. %, about 0.005 wt. % to about 1.25 wt. %, about 0.005 wt. % to about 1 wt. %, about 0.01 wt. % to about 2 wt. %, about 0.01 wt. % to about 1.75 wt. %, about 0.01 wt. % to about 1.5 wt. %, about 0.05 wt. % to about 2 wt. %, about 0.05 wt. % to about 1.5 wt. %, about 0.1 wt. % to about 2 wt. %, or about 0.1 wt. % to about 1.5 wt. %. More preferably, the additional abrasive particles are present in the polishing composition at a concentration of about 0.01 wt. % to about 0.5 wt. %, e.g., about 0.025 wt. %, about 0.05 wt. %, about 0.08 wt. %, about 0.1 wt. %, about 0.15 wt. %, about 0.2 wt. %, about 0.25 wt. %, about 0.3 wt. %, or about 0.4 wt. %.

When the polishing composition comprises additional abrasive particles (e.g., second abrasive particles, third abrasive particles, etc.), the polishing composition optionally can exhibit a multimodal particle size distribution. As used herein, the term "multimodal" means that the polishing composition exhibits a median particle size distribution having at least 2 maxima (e.g., 2 or more maxima, 3 or more maxima, 4 or more maxima, or 5 or more maxima). In particular, when the polishing composition comprises second abrasive particles, the polishing composition can exhibit a bimodal particle size distribution, i.e., the polishing composition exhibits a particle size distribution having 2 median particle size maxima. The terms "maximum" and "maxima" mean a peak or peaks in the particle size distribution. The peak or peaks correspond to the median particle sizes described herein for the first, second, and any additional abrasive particles. Thus, for example, when the polishing composition contains first abrasive particles and second abrasive particles, with no additional abrasive particles, then a plot of the number of particles or relative weight of the particles versus particle size can reflect a bimodal particle size distribution, with a first peak in the particle size range of about 40 nm to about 100 nm and a second peak in the particle size range of about 1 nm to about 35 nm.

The first abrasive particles and any additional abrasive particles present in the polishing composition desirably are suspended in the polishing composition, more specifically in the aqueous carrier of the polishing composition. When the abrasive particles are suspended in the polishing composition, the abrasive particles preferably are colloidally stable. The term colloid refers to the suspension of abrasive particles in the aqueous carrier. Colloidal stability refers to the maintenance of that suspension over time. In the context of this invention, abrasive particles are considered colloidally stable if, when the abrasive particles are placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C]≤0.5). The value of [B]−[T]/[C] desirably is less than or equal to 0.3, and preferably is less than or equal to 0.1.

The polishing composition further comprises a functionalized heterocycle selected from a functionalized nitrogen-containing heterocycle, a functionalized sulfur-containing heterocycle, a naphthoic acid, and combinations thereof. The functionalized heterocycle can be functionalized with any suitable functional group. For example, the functionalized heterocycle can be functionalized with a carboxylic acid, a sulfonic acid, a phosphoric acid, an amine, or combinations thereof. Preferably, the functionalized heterocycle is functionalized with a carboxylic acid.

The functionalized nitrogen-containing heterocycle can be any suitable functionalized nitrogen-containing heterocycle. For example, the functionalized nitrogen-containing heterocycle can be selected from a pyridine, a pyrazine, a pyrimidine, a pyridazine, a quinoline, a benzotriazole, a benzothiazole, a triazole, an indole, a benzimidazole, and combinations thereof. In particular, the functionalized nitrogen-containing heterocycle can be selected from picolinic acid, picolylamine, quinaldic acid, and combinations thereof.

The nitrogen of the functionalized nitrogen-containing heterocycle can have any suitable pKa. For example, the nitrogen of the functionalized nitrogen-containing heterocycle can have a pKa of about 5 or more, e.g., about 6 or more, about 8 or more, about 10 or more, or about 15 or more. Preferably, the nitrogen of the functionalized nitrogen-containing heterocycle has a pKa that is greater than the pH of the polishing composition. For example, if the pH of the polishing composition is about 1, the nitrogen of the functionalized nitrogen-containing heterocycle can have a pKa that is more than about 1, e.g., more than about 2, more than about 3, more than about 3.5, more than about 4, more than about 4.5, more than about 5, or more than about 5.5.

The functionalized sulfur-containing heterocycle can be any suitable functionalized sulfur-containing heterocycle. For example, the functionalized sulfur-containing heterocycle can be a thiophene. In particular, the functionalized sulfur-containing heterocycle can be 2-carboxythiophene.

The functionalized heterocycle can be any suitable naphthoic acid. For example, the functionalized heterocycle can be a naphthoic acid selected from 2-hydroxy-1-naphthoic acid, 3-hydroxy-2-naphthoic acid, 3,5-dihydroxy-2-naphthoic acid, 1,4-dihydroxy-2-naphthoic acid, and combinations thereof.

Preferably, the polishing composition comprises a functionalized heterocycle that is a functionalized nitrogen-containing heterocycle. More preferably, the polishing composition comprises a functionalized nitrogen-containing heterocycle selected from a pyridine, a quinoline, and combinations thereof. Even more preferably, the polishing composition comprises a functionalized nitrogen-containing heterocycle selected from picolinic acid, quinaldic acid, and combinations thereof.

Thus, the functionalized heterocycle can comprise a functionalized nitrogen-containing heterocycle, wherein the functionalized nitrogen-containing heterocycle is picolinic acid. In addition, the polishing composition can comprise a functionalized nitrogen-containing heterocycle, wherein the functionalized nitrogen-containing heterocycle is quinaldic acid.

The functionalized heterocycle is present in the polishing composition at a concentration of about 100 ppm to about 1500 ppm. For example, the functionalized heterocycle can be present in the polishing composition at a concentration of about 100 ppm to about 1300 ppm, e.g., about 100 ppm to about 1200 ppm, about 100 ppm to about 1000 ppm, about 100 ppm to about 800 ppm, about 100 ppm to about 750 ppm, about 100 ppm to about 650 ppm, about 100 ppm to about 500 ppm, about 250 ppm to about 1000 ppm, about 250 ppm to about 800 ppm, about 500 ppm to about 1000 ppm, or about 500 ppm to about 800 ppm. Preferably, the functionalized heterocycle is present in the polishing composition at a concentration of about 100 ppm to about 800 ppm, e.g., about 200 ppm, about 300 ppm, about 450 ppm, about 500 ppm, about 600 ppm, about 700 ppm, or about 750 ppm.

The polishing composition further comprises a pH-adjusting agent. The pH-adjusting agent can be any suitable pH-adjusting agent. For example, the pH-adjusting agent can be an alkyl amine, an alcohol amine, quaternary amine hydroxide, ammonia, or a combination thereof. In particular, the pH-adjusting agent can be triethanolamine, tetramethylammonium hydroxide (TMAH or TMA-OH), or tetraethyl-ammonium hydroxide (TEAH or TEA-OH). Preferably, the pH-adjusting agent is triethanolamine.

The pH-adjusting agent can be present in the polishing composition in any suitable concentration. Desirably, the pH-adjusting agent is present in the polishing composition at a sufficient concentration to achieve and/or maintain the pH of the polishing composition within the pH ranges set forth herein, e.g., in the range of about 1 to about 6, or in the range of about 3.5 to about 5. For example, the pH-adjusting agent can be present in the polishing composition at a concentration of about 10 ppm to about 300 ppm, e.g., about 50 ppm to about 200 ppm, or about 100 ppm to about 150 ppm.

The polishing composition includes an aqueous carrier. The aqueous carrier contains water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The pH of the polishing composition is about 1 to about 6. Typically, the polishing composition has a pH of about 3 or greater. Also, the pH of the polishing composition typically is about 6 or less. For example, the pH can be in the range of about 3.5 to about 6, e.g., a pH of about 3.5, a pH of about 4, a pH of about 4.5, a pH of about 5, a pH of about 5.5, a pH of about 6, or a pH in a range defined by any two of these pH values.

The polishing composition also can comprise an additive selected from an anionic copolymer of a carboxylic acid monomer, a sulfonated monomer, or a phosphonated monomer, and an acrylate, a polyvinylpyrrolidone, or a polyvinylalcohol (e.g., a copolymer of 2-hydroxyethylmethacrylic acid and methacrylic acid); a nonionic polymer, wherein the nonionic polymer is polyvinylpyrrolidone or polyethylene glycol; a silane, wherein the silane is an amino silane, an ureido silane, or a glycidyl silane; an N-oxide of a functionalized pyridine (e.g., picolinic acid N-oxide); a starch; a cyclodextrin (e.g., alpha-cyclodextrin or beta-cyclodextrin), and combinations thereof.

When the additive is a nonionic polymer, and when the nonionic polymer is polyvinylpyrrolidone, the polyvinylpyrrolidone can have any suitable molecular weight. For example, the polyvinylpyrrolidone can have a molecular weight of about 10,000 g/mol to about 1,000,000 g/mol, e.g., about 20,000 g/mol, about 30,000 g/mol, about 40,000 g/mol, about 50,000 g/mol, or about 60,000 g/mol. When the additive is a nonionic polymer, and when the nonionic polymer is polyethylene glycol, the polyethylene glycol can have any suitable molecular weight. For example, the polyethylene glycol can have a molecular weight of about 200 g/mol to about 200,000 g/mol, e.g., about 8000 g/mol, about 100,000 g/mol.

When the additive is a silane, the silane can be any suitable amino silane, ureido silane, or glycidyl silane. For example, the silane can be 3-aminopropyltrimethoxysilane, 3-aminopropylsilanetriol, N-(2-aminoethyl)-3-aminopropyltrimethoxysilane, N-(2-aminoethyl)-3-aminopropyltrimethoxysilanetriol, (N,N-dimethyl-3-aminopropyl) trimethoxysilane, N-phenyl-3-aminopropyltrimethoxysilane, ureidopropyltriethoxysilane, or 3-glycidopropyldimethylethoxysilane.

Preferably, when the polishing composition comprises an additive, the additive is selected from a copolymer of 2-hydroxyethylmethacrylic acid and methacrylic acid, polyvinylpyrrolidone, aminopropylsilanetriol, picolinic acid N-oxide, starch, alpha-cyclodextrin, beta-cyclodextrin, and combinations thereof.

The additive (i.e., the anionic copolymer of a carboxylic acid monomer, a sulfonated monomer, or a phosphonated monomer, and an acrylate, a polyvinylpyrrolidone, or a polyvinylalcohol; the silane; the N-oxide of a functionalized pyridine; the starch; the cyclodextrin; or a combination thereof, in total) can be present in the chemical-mechanical polishing composition at any suitable concentration. Preferably, the additive is present in the polishing composition at a concentration of about 1 ppm to about 500 ppm, e.g., about 5 ppm to about 400 ppm, about 10 ppm to about 400 ppm, about 15 ppm to about 400 ppm, about 20 ppm to about 400 ppm, about 25 ppm to about 400 ppm, about 10 ppm to about 300 ppm, about 10 ppm to about 250 ppm, about 30 ppm to about 350 ppm, about 30 ppm to about 275 ppm, about 50 ppm to about 350 ppm, or about 100 ppm to about 300 ppm. More preferably, the additive is present in the polishing composition at a concentration of about 1 ppm to about 300 ppm, e.g., about 1 ppm to about 275 ppm, about 1 ppm to about 250 ppm, about 1 ppm to about 100 ppm, about 1 ppm to about 50 ppm, about 10 ppm to about 250 ppm, about 10 ppm to about 100 ppm, or about 35 ppm to about 250 ppm.

The polishing composition optionally further comprises a cationic polymer. The cationic polymer is selected from a quaternary amine, a cationic polyvinyl alcohol, a cationic cellulose, and combinations thereof. The polishing composition optionally can comprise a cationic polymer selected from a quaternary amine, a cationic polyvinyl alcohol, a cationic cellulose, and combinations thereof, in addition to one or more of the additives described above, i.e., one or more of an anionic copolymer of a carboxylic acid monomer, a sulfonated monomer, or a phosphonated monomer, and an acrylate, a polyvinylpyrrolidone, or a polyvinylalcohol; a nonionic polymer; a silane; an N-oxide of a functionalized pyridine; a starch; and a cyclodextrin. Alternatively, the polishing composition can comprise a cationic polymer without one or more of the additives described above, i.e., without one or more of an anionic copolymer of a carboxylic acid monomer, a sulfonated monomer, or a phosphonated monomer, and an acrylate, a polyvinylpyrrolidone, or a polyvinylalcohol; a nonionic polymer; a silane; an N-oxide of a functionalized pyridine; a starch; and a cyclodextrin.

The cationic polymer can be any suitable quaternary amine. For example, the cationic polymer can be a quaternary amine selected from poly(vinylimidazolium), a poly (methacryloyloxyethyltrimethylammonium) halide such as poly(methacryloyloxyethyltrimethylammonium) chloride (polyMADQUAT), a poly(diallyldimethylammonium) halide such as poly(diallyldimethylammonium) chloride (polyDADMAC), and polyquaternium-2. Preferably, when the cationic polymer is a quaternary amine, the cationic polymer is poly(vinylimidazolium).

The cationic polymer can be any suitable cationic polyvinyl alcohol or cationic cellulose. Preferably, the cationic polymer is a cationic polyvinyl alcohol. For example, the cationic polyvinyl alcohol can be the Nippon Gosei GOHSEFIMER K210™ polyvinyl alcohol product.

The cationic polymer (i.e., the quaternary amine, the cationic polyvinyl alcohol, the cationic cellulose, or a combination thereof, in total) can be present in the polishing composition at any suitable concentration. Preferably, the cationic polymer is present in the polishing composition at a concentration of about 1 ppm to about 250 ppm, e.g., about 1 ppm to about 100 ppm, about 1 ppm to about 50 ppm, about 1 ppm to about 40 ppm, about 1 ppm to about 25 ppm, about 5 ppm to about 225 ppm, about 5 ppm to about 100 ppm, about 5 ppm to about 50 ppm, about 10 ppm to about 215 ppm, about 10 ppm to about 100 ppm, about 15 ppm to about 200 ppm, about 25 ppm to about 175 ppm, about 25 ppm to about 100 ppm, or about 30 ppm to about 150 ppm.

When the cationic polymer is poly(vinylimidazolium), the cationic polymer preferably is present in the polishing composition at a concentration of about 1 ppm to about 10 ppm, e.g., about 2 ppm, about 5 ppm, about 6 ppm, about 7 ppm, about 8 ppm, or about 9 ppm. More preferably, when the cationic polymer is poly(vinylimidazolium), the cationic polymer preferably is present in the polishing composition at a concentration of about 1 ppm to about 5 ppm, e.g., about 2 ppm, about 3 ppm, or about 4 ppm.

When the polishing composition comprises a cationic polymer, and when the cationic polymer is a quaternary amine, the polishing composition further comprises a carboxylic acid. When the polishing composition comprises a cationic polymer, and when the cationic polymer is selected from a cationic polyvinyl alcohol and a cationic cellulose, the polishing composition optionally further comprises a carboxylic acid. The pKa of the carboxylic acid is about 1 to about 6. Preferably, the pKa of the carboxylic acid is about 2 to about 6. More preferably, the pKa of the carboxylic acid is about 3.5 to about 5.

The carboxylic acid can be any suitable carboxylic acid having a pKa of about 1 to about 6. For example, the carboxylic acid can be selected from acetic acid, propionic acid, and butanoic acid. Preferably, the carboxylic acid is acetic acid.

The carboxylic acid can be present in the polishing composition at any suitable concentration. Preferably, the carboxylic acid is present in the polishing composition at a concentration of about 10 ppm to about 1000 ppm, e.g., about 10 ppm to about 500 ppm, about 10 ppm to about 250 ppm, about 25 ppm to about 750 ppm, about 25 ppm to about 500 ppm, about 25 ppm to about 250 ppm, about 30 ppm to about 250 ppm, about 35 ppm to about 350 ppm, about 50 ppm to about 425 ppm, about 55 ppm to about 400 ppm, or about 75 ppm to about 350 ppm. More preferably, the carboxylic acid is present in the polishing composition at a concentration of about 25 ppm to about 150 ppm, e.g. about 40 ppm, about 50 ppm, about 60 ppm, about 75 ppm, about 100 ppm, or about 125 ppm.

Desirably, the pH of the polishing composition is within about 2 units of the pKa of the carboxylic acid. As an example, if the pH of the polishing composition is about 3.5, the pKa of the carboxylic acid preferably is about 1.5 to about 5.5.

The polishing composition optionally further comprises one or more other additives. The polishing composition can comprise a surfactant and/or rheological control agent, including viscosity enhancing agents and coagulants (e.g., polymeric rheological control agents, such as, for example, urethane polymers), a dispersant, a biocide (e.g., KATHON™ LX), and the like. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition can be prepared by any suitable technique, many of which are known to those skilled in the art. The polishing composition can be prepared in a batch or continuous process. Generally, the polishing composition can be prepared by combining the components herein in any order. The term "component" as used herein includes individual ingredients (e.g., first abrasive particles, functionalized heterocycle, pH-adjusting agent, etc.) as well as any combination of ingredients (e.g., first abrasive particles, functionalized heterocycle, pH-adjusting agent, etc.).

For example, the functionalized heterocycle can be added to water at the desired concentration(s). The pH can then be adjusted (as desired) and the first abrasive particles can be added to the mixture at the desired concentration to form the polishing composition. The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise first abrasive particles, a functionalized heterocycle, a pH-adjusting agent, and water, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line)

can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides a method of polishing a substrate with the polishing composition described herein. The method of polishing a substrate comprises (i) providing a substrate; (ii) providing a polishing pad; (iii) providing the aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

In addition, the invention provides a method of polishing a substrate comprising (i) providing a substrate, wherein the substrate comprises a silicon oxide layer; (ii) providing a polishing pad; (iii) providing the aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the silicon oxide layer on a surface of the substrate to polish the substrate.

More specifically, the invention provides a method of polishing a substrate comprising (i) providing a substrate, wherein the substrate comprises a silicon oxide layer; (ii) providing a polishing pad; (iii) providing a chemical-mechanical polishing composition comprising (a) first abrasive particles, wherein the first abrasive particles are wet-process ceria particles, have a median particle size of about 40 nm to about 100 nm, are present in the polishing composition at a concentration of about 0.005 wt. % to about 2 wt. %, and have a particle size distribution of at least about 300 nm, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a pH-adjusting agent, and (d) an aqueous carrier, wherein the pH of the polishing composition is about 1 to about 6; (iv) contacting the substrate with the polishing pad and the chemical-mechanical polishing composition; and (v) moving the polishing pad and the chemical-mechanical polishing composition relative to the substrate to abrade at least a portion of the silicon oxide layer on a surface of the substrate to polish the substrate.

The polishing compositions of the invention are useful for polishing any suitable substrate. The polishing compositions are particularly useful in the polishing of a substrate comprising a silicon oxide layer. Suitable substrates include, but are not limited to, flat panel displays, integrated circuits, memory or rigid disks, metals, semiconductors, inter-layer dielectric (ILD) devices, microelectromechanical systems (MEMS), ferroelectrics, and magnetic heads. The polishing composition is particularly well-suited for planarizing or polishing a substrate that has undergone shallow trench isolation (STI) processing. The substrate can further comprise at least one other layer, e.g., an insulating layer. The insulating layer can be a metal oxide, porous metal oxide, glass, organic polymer, fluorinated organic polymer, or any other suitable high or low-K insulating layer. The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise, consist essentially of, or consist of any suitable metal, many of which are known in the art, such as, for example, copper, tantalum, tungsten, titanium, platinum, ruthenium, iridium, aluminum, nickel, or combinations thereof.

In accordance with the invention, a substrate can be planarized or polished with the polishing composition described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with a polishing composition of the invention and typically a polishing pad and then abrading at least a portion of the surface of the substrate, e.g., the silicon oxide, or one or more of the substrate materials described herein, with the polishing composition and typically the polishing pad to polish the substrate. Any suitable polishing conditions can be used to polish a substrate according to the invention.

A substrate can be planarized or polished with the chemical-mechanical polishing composition in conjunction with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

EMBODIMENTS (1) In embodiment (1) is presented a chemical-mechanical polishing composition comprising:

(a) first abrasive particles, wherein the first abrasive particles are wet-process ceria particles, have a median particle size of about 40 nm to about 100 nm, are present in the polishing composition at a concentration of about 0.005 wt. % to about 2 wt. %, and have a particle size distribution of at least about 300 nm, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a pH-adjusting agent, and (d) an aqueous carrier, wherein the pH of the polishing composition is about 1 to about 6.

(2) In embodiment (2) is presented the chemical-mechanical polishing composition of embodiment (1), wherein the first abrasive particles have a surface that comprises tridentate hydroxyl groups, and wherein the first abrasive particles have a surface coverage of tridentate hydroxyl groups that is about $2.0 \times 10^{-5}$ moles/m$^2$ or more.

(3) In embodiment (3) is presented the chemical-mechanical polishing composition of embodiment (1) or (2), wherein a Raman spectrum of the first abrasive particles comprises a peak at about 458 cm$^{-1}$ and a peak at about 583 cm$^{-1}$, and wherein the ratio of the intensity of the peak at about 458 cm$^{-1}$ to the intensity of the peak at about 583 cm$^{-1}$ is about 100 or less.

(4) In embodiment (4) is presented the chemical-mechanical polishing composition of any one of embodiments (1)-(3), wherein the first abrasive particles are present in the polishing composition at a concentration of about 0.1 wt. % to about 0.5 wt. %.

(5) In embodiment (5) is presented the chemical-mechanical polishing composition of any one of embodiments (1)-(4), wherein the functionalized heterocycle comprises a functionalized nitrogen-containing heterocycle selected from nicotinic acid, quinaldic acid, and combinations thereof.

(6) In embodiment (6) is presented the chemical-mechanical polishing composition of any one of embodiments (1)-(5), wherein the pH-adjusting agent is selected from an alkyl amine, an alcohol amine, a quaternary amine hydroxide, ammonia, and combinations thereof.

(7) In embodiment (7) is presented the chemical-mechanical polishing composition of embodiment (6), wherein the pH-adjusting agent is triethanolamine.

(8) In embodiment (8) is presented the chemical-mechanical polishing composition of any one of embodiments (1)-(7), wherein the pH of the polishing composition is about 3.5 to about 5.

(9) In embodiment (9) is presented the chemical-mechanical polishing composition of any one of embodiments (1)-(8), wherein the polishing composition further comprises an additive selected from an anionic copolymer of a carboxylic acid monomer, a sulfonated monomer, or a phosphonated monomer, and an acrylate, a polyvinylpyrrolidone, or a polyvinylalcohol, a nonionic polymer, wherein the nonionic polymer is polyvinylpyrrolidone or polyethylene glycol, a silane, wherein the silane is an amino silane, an ureido silane, or a glycidyl silane, an N-oxide of a functionalized pyridine, a starch, a cyclodextrin, and combinations thereof, wherein the additive is present in the chemical-mechanical polishing composition at a concentration of about 25 ppm to about 500 ppm.

(10) In embodiment (10) is presented the chemical-mechanical polishing composition of embodiment (9), wherein the additive is selected from a copolymer of 2-hydroxyethylmethacrylic acid and methacrylic acid, polyvinylpyrrolidone, aminopropylsilanetriol, picolinic acid N-oxide, starch, alpha-cyclodextrin, beta-cyclodextrin, and combinations thereof.

(11) In embodiment (11) is presented the chemical-mechanical polishing composition of any one of embodiments (1)-(10), wherein the polishing composition further comprises:

a cationic polymer, wherein the cationic polymer is a quaternary amine, and wherein the cationic polymer is present in the polishing composition at a concentration of about 1 ppm to about 250 ppm, and a carboxylic acid, wherein the pKa of the carboxylic acid is about 1 to about 6, and wherein the carboxylic acid is present in the polishing composition at a concentration of about 25 ppm to about 500 ppm, wherein the pH of the polishing composition is within about 2 units of the pKa of the carboxylic acid.

(12) In embodiment (12) is presented the chemical-mechanical polishing composition of embodiment (11), wherein the cationic polymer is poly(vinylimidazolium).

(13) In embodiment (13) is presented the chemical-mechanical polishing composition of embodiment (11) or (12), wherein the pKa of the carboxylic acid is about 3.5 to about 5.

(14) In embodiment (14) is presented the chemical-mechanical polishing composition of any one of embodiments (11)-(13), wherein the carboxylic acid is acetic acid.

(15) In embodiment (15) is presented the chemical-mechanical polishing composition of any one of embodiments (1)-(10), wherein the polishing composition further comprises a cationic polymer selected from a cationic polyvinyl alcohol and a cationic cellulose, and wherein the cationic polymer is present in the polishing composition at a concentration of about 1 ppm to about 250 ppm.

(16) In embodiment (16) is presented a method of polishing a substrate comprising:
(i) providing a substrate;
(ii) providing a polishing pad;
(iii) providing the chemical-mechanical polishing composition of any one of embodiments (1)-(15),
(iv) contacting the substrate with the polishing pad and the chemical-mechanical polishing composition; and
(v) moving the polishing pad and the chemical-mechanical polishing composition relative to the substrate to abrade at least a portion of the substrate to polish the substrate.

(17) In embodiment (17) is presented a method of polishing a substrate comprising:
(i) providing a substrate, wherein the substrate comprises a silicon oxide layer;
(ii) providing a polishing pad;
(iii) providing the chemical-mechanical polishing composition of any one of embodiments (1)-(15),
(iv) contacting the substrate with the polishing pad and the chemical-mechanical polishing composition; and
(v) moving the polishing pad and the chemical-mechanical polishing composition relative to the substrate to abrade at least a portion of the silicon oxide layer on a surface of the substrate to polish the substrate.

EXAMPLES

The following examples further illustrate the invention but, of course, should not be construed as in any way limiting its scope.

Example 1

This example demonstrates the effectiveness of a polishing composition including abrasive particles that are wet-process ceria particles, have a median particle size of about 40 nm to about 100 nm, and have a particle size distribution that is at least about 300 nm, i.e., first abrasive particles according to the invention.

Tetraethoxysilane (TEOS) blanket wafers were polished with three polishing compositions (i.e., Polishing Compositions 1A-1C). Each of Polishing Compositions 1A-1C contained 350 ppm picolinic acid and water, and was pH-adjusted to pH 4.0 using triethanolamine. Each polishing composition also contained 0.2 wt. % wet-process ceria particles of the type(s) listed in Table 2. In particular, for each of the abrasive particles included in Polishing Compositions 1A-1C, Table 2 lists the median particle size ("MPS") and the particle size distribution of the abrasive particles ("PSD"), as determined by disc centrifuge, i.e., by CPS Disc Centrifuge Model DC24000UHR. For Polishing Composition 1B, which comprises a mixture of ceria particles, Table 2 reflects the particle size distribution of the mixture of ceria particles as determined by disc centrifuge, i.e., by CPS Disc Centrifuge Model DC24000UHR.

Table 2 also lists the surface coverage of tridentate hydroxyl groups present on the surface of the abrasive particles ("Surface Tridentate Hydroxyl") included in Polishing Compositions 1A-1C. More specifically, the abrasive particles included in Polishing Compositions 1A-1C were characterized according to the content of tridentate hydroxyl groups present on the surface of the particles. The amount of tridentate hydroxyl groups present on the surface of the particles was determined in accordance with the procedure described herein. In particular, acid/base titration was used to approximate the amount of tridentate hydroxyl groups present on the surface of the particles. The particles were adjusted to pH 2.5 with $HClO_4$, and then titrated with KOH. The area of the peak shoulder just below pH 6 was calculated and used to determine the amount of tridentate hydroxyl groups present on the surface of the particles. The amount of the tridentate hydroxyl groups present on the surface of the particles was divided by the BET surface area of the particles to determine the surface coverage of tridentate hydroxyl groups (moles/$m^2$). The first abrasive particles included in Polishing Composition 1A had a BET surface area of about 13 $m^2$/g; the first abrasive particles included in Polishing Composition 1B had a BET surface area of about 30 $m^2$/g; the second abrasive particles included in Polishing Composition 1B had a BET surface area of about 13 $m^2$/g; and the first abrasive particles included in Polishing Composition 1C had a BET surface area of about 30.8 $m^2$/g.

Table 2 also lists the ratio of the intensity of the peak at about 458 $cm^{-1}$ to the intensity of the peak at about 583 $cm^{-1}$ ("Peak Ratio") on Raman spectra of the abrasive particles included in Polishing Compositions 1A-1C. More specifically, the ratio of the intensity of the peak at about 458 $cm^{-1}$ to the intensity of the peak at about 583 $cm^{-1}$ for the particles included in Polishing Compositions 1A-1C was determined in accordance with the procedure described herein. In particular, the particles were centrifuged, the supernatant was removed, and the particles were dried overnight at 60° C. Raman spectra were collected on the dry powder using a 532 nm laser.

TABLE 2

Particle Size and Surface Characteristics of Abrasive Particles

| | First Abrasive Particles | | | Second Abrasive Particles | | | |
|---|---|---|---|---|---|---|---|
| Polishing Composition | MPS (nm) | Surface Tridentate Hydroxyl (moles/m²) | Peak Ratio | MPS (nm) | Surface Tridentate Hydroxyl (moles/m²) | Peak Ratio | PSD (nm) |
| 1A (comparative) | 103 | 0 | 229.3 | — | — | — | about 200 |
| 1B (comparative) | 54 | 1.76 × 10⁻⁶ | 71.4 | 103 | 0 | 229.3 | about 200 |
| 1C (inventive) | 73 | 2.3 × 10⁻⁵ | 54.8 | — | — | — | about 380 |

FIG. 1 illustrates the difference in median particle size and particle size distribution exhibited by the different types of wet-process ceria particles included in Polishing Compositions 1A-1C. In particular, FIG. 1 illustrates the median particle size and the particle size distribution for (1) wet-process ceria particles having a median particle size of about 103 nm and a particle size distribution of about 200 nm (i.e., the comparative ceria particles included in Polishing Composition 1A), (2) a mixture of wet-process ceria particles having a median particle size about 54 nm and wet-process ceria particles having a median particle size of about 103 nm, wherein the mixture of ceria particles has a particle size distribution of about 200 nm (i.e., the comparative ceria particles included in Polishing Composition 1B), and (3) wet-process ceria particles having a median particle size of about 73 nm and a particle size distribution of about 380 nm (i.e., the first abrasive particles according to the invention included in Polishing Composition 1C). As shown in FIG. 1, the first abrasive particles according to the invention included in Polishing Composition 1C exhibit a much broader particle size distribution as compared to the particle size distribution of the comparative ceria particles included in Polishing Compositions 1A and 1B, even though Polishing Composition 1B includes a mixture of ceria particles which have two distinct median particle sizes.

FIG. 2 illustrates the titration curve of wet-process ceria particles having a median particle size of about 103 nm and a particle size distribution of about 200 nm (i.e., the comparative ceria particles included in Polishing Composition 1A), as well as the titration curve of wet-process ceria particles having a median particle size of about 73 nm and having a particle size distribution of about 380 nm (i.e., the first abrasive particles according to the invention included in Polishing Composition 1C). In particular, FIG. 2 plots pH versus volume of KOH (mL) for first abrasive particles according to the invention and for comparative ceria particles.

FIG. 3 illustrates the normalized first derivative of the titration curves shown in FIG. 2. More specifically, FIG. 3 illustrates the normalized first derivative of the titration curve of first abrasive particles according to the invention and of comparative ceria particles. As shown in FIG. 3, the normalized first derivative of the titration curve for the comparative ceria particles shows only one peak at approximately pH 7, suggesting that the only thing measured is the deprotonation of water. In contrast, the normalized first derivative of the titration curve for the first abrasive particles according to the invention shows two peaks: a peak shoulder just below pH 6, and a dominant peak for the deprotonation of water at approximately pH 7. The peak shoulder just below pH 6 corresponds to the tridentate hydroxyl groups present on the surface of the first abrasive particles according to the invention.

FIG. 4 illustrates a Raman spectrum for wet-process ceria particles having a median particle size of 73 nm and a particle size distribution of 380 nm (i.e., the first abrasive particles according to the invention included in Polishing Composition 1C). As shown in FIG. 4, the most dominant peak in the spectrum is present at about 458 cm⁻¹, corresponding to the Ce—O vibration. FIG. 4 also illustrates a smaller peak at about 583 cm⁻¹, which is sensitive to surface defectivity, and which increases in intensity as defects on the surface of the particles increase.

FIG. 5 illustrates the ratio of the intensity of the peak at about 458 cm⁻¹ to the intensity of the peak at about 583 cm⁻¹ on the Raman spectra of three different lots of wet-process ceria particles having a median particle size of about 73 nm and a particle size distribution of about 380 nm (i.e., three lots of first abrasive particles according to the invention). The first abrasive particles from lot 1 were included in Polishing Composition 1C. FIG. 5 also illustrates the ratio of the intensity of the peak at about 458 cm⁻¹ to the intensity of the peak at about 583 cm⁻¹ on the Raman spectrum of wet-process ceria particles having a median particle size of about 103 nm and a particle size distribution of about 200 nm (i.e., the comparative ceria particles included in Polishing Composition 1A). As shown in FIG. 5, the ratios of the intensity of the peak at about 458 cm⁻¹ to the intensity of the peak at about 583 cm⁻¹ on the Raman spectra are as follows:

TABLE 3

Characterization of Defects on the Surface of Particles by Raman Spectroscopy

| Ceria Particles | Intensity of Peak at 458 cm⁻¹ | Intensity of Peak at 583 cm⁻¹ | Ratio of the intensity of the peak at about 458 cm⁻¹ to the intensity of the peak at about 583 cm⁻¹ |
|---|---|---|---|
| First Abrasive Particles - Lot 1 | 9482.7 | 173.1 | 54.8 |
| First Abrasive Particles - Lot 2 | 19688.2 | 381.1 | 51.7 |
| First Abrasive Particles - Lot 3 | 6336.1 | 116.5 | 54.4 |
| Comparative Ceria Particles | 16420.6 | 71.6 | 229.3 |

As illustrated by FIG. 5 and Table 3, first abrasive particles according to the invention have a smaller ratio of the intensity of the peak at about 458 cm⁻¹ to the intensity of the peak at about 583 cm⁻¹, in contrast to comparative ceria particles, which have a larger ratio of the intensity of the peak at about 458 cm⁻¹ to the intensity of the peak at about 583 cm⁻¹. Thus, FIG. 5 illustrates that first abrasive particles according to the invention have a higher amount of defects on the surface of the particles.

The TEOS blanket wafers were polished with Polishing Compositions 1A-1C under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the removal rates of the blanket TEOS were determined in Å/min. The results are summarized in Table 4.

TEOS pattern wafers also were polished with Polishing Compositions 1B and 1C. The TEOS pattern wafers had a 500 μm feature size with 50% density. The TEOS pattern wafers were polished with Polishing Compositions 1A and 1B under the same polishing conditions. In particular, the wafers were polished on a Reflexion™ polisher (Applied Materials) with an IC 1010™ pad (Dow Chemical). The polishing parameters were as follows: 12.41 kPa (1.8 psi) downforce, 126 rpm platen speed, 125 rpm head speed, and 200 mL/min polishing flow. The remaining TEOS step height (Å) and trench loss (Å) were determined after 55 seconds of polishing ("55 s"), 60 seconds of polishing ("60 s"), 65 seconds of polishing ("65 s"), and 70 seconds of polishing ("70 s"). The results are summarized in Table 4.

ceria particles having a median particle size of about 103 nm, wherein the mixture of ceria particles has a particle size distribution of about 200 nm. As shown in FIG. 6, Polishing Composition 1C exhibited lower trench loss as polishing progressed and as the remaining step height was reduced. Thus, these results demonstrate that Polishing Composition 1C provides an improvement in planarization efficiency as compared to Polishing Composition 1B.

Example 2

This example demonstrates the effectiveness of a polishing composition including first abrasive particles according to the invention and an additive that is an anionic copolymer of a carboxylic acid monomer, a sulfonated monomer, or a phosphonated monomer, and an acrylate, a polyvinylpyrrolidone, or a polyvinylalcohol.

Tetraethoxysilane (TEOS) blanket wafers were polished with four polishing compositions (i.e., Polishing Compositions 2A-2D). Each of Polishing Compositions 2A-2D contained 0.285 wt. % wet-process ceria particles having a median particle size of about 73 nm, a particle size distribution of about 380 nm, a surface coverage of tridentate

TABLE 4

Blanket Silicon Oxide Removal Rates, Trench Loss, and Remaining Silicon Oxide Step Height, as a Function of Abrasive Particles

| Polishing Composition | Blanket TEOS Removal Rate (Å/min) | Trench Loss (Å) | | | | Remaining TEOS Step Height (Å) | | | |
|---|---|---|---|---|---|---|---|---|---|
| | | 55 s | 60 s | 65 s | 70 s | 55 s | 60 s | 65 s | 70 s |
| 1A (comparative) | 3697 | — | — | — | — | — | — | — | — |
| 1B (comparative) | 4881 | — | — | 493 | 1028 | — | — | 1860 | 784 |
| 1C (inventive) | 7365 | 163 | 278 | 871 | — | 2223 | 1771 | 759 | — |

These results demonstrate that a polishing composition comprising first abrasive particles according to the invention is particularly effective for polishing substrates comprising a silicon oxide layer (i.e., TEOS). In particular, Polishing Composition 1C exhibited a blanket TEOS removal rate that was significantly greater than the blanket TEOS removal rates provided by Polishing Compositions 1A and 1B, which did not contain first abrasive particles according to the invention, but contained wet-process ceria particles having particle size distributions that were significantly less than 300 nm. Thus, these results demonstrate the improvement in removal rate provided by wet-process ceria particles having a broad particle size distribution and optimized surface chemistry.

These results further demonstrate that a polishing composition comprising first abrasive particles according to the invention provides improved planarization efficiency. FIG. 6 and Table 4 illustrate the relationship between the trench loss (Å) and remaining step height (Å) for Polishing Compositions 1B and 1C. In particular, FIG. 6 illustrates the remaining step height (Å) versus trench loss (Å) for Polishing Composition 1C, which includes wet-process ceria particles having a median particle size of about 73 nm and a particle size distribution of about 380 nm, as well as for Polishing Composition 1B, which includes a mixture of wet-process ceria particles having a median particle size about 54 nm and hydroxyl groups that is about $2.3 \times 10^{-5}$ moles/m$^2$, and, on a Raman spectrum, a ratio of the intensity of the peak at about 458 cm$^{-1}$ to the intensity of the peak at about 583 cm$^{-1}$ of about 54.8. Each of Polishing Compositions 2A-2D also contained 500 ppm picolinic acid and water, and was pH-adjusted to pH 4.0 using triethanolamine. Polishing compositions 2B-2D also contained a copolymer of 2-hydroxyethylmethacrylic acid and methacrylic acid of the type and in the amount listed in Table 5. In particular, Table 5 reports the ratio of 2-hydroxyethylmethacrylic acid to methacrylic acid included in the anionic copolymer.

TEOS pattern wafers also were polished for 50 seconds with Polishing Compositions 2A-2D. The TEOS pattern wafers had a 500 μm feature size with 50% density. The TEOS blanket wafers and TEOS pattern wafers were polished with Polishing Compositions 2A-2D under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the removal rates of the blanket TEOS and pattern TEOS (Å/min), the trench loss (Å), and the remaining TEOS step height (Å) were determined. The results are summarized in Table 5.

TABLE 5

Blanket and Pattern Silicon Oxide Removal Rates, Trench Loss, and Remaining Silicon Oxide Step Height, as a Function of Anionic Copolymer Additive

| Polishing Composition | Anionic Copolymer Ratio | Anionic Copolymer Amount (ppm) | Blanket TEOS Removal Rate (Å/min) | Pattern TEOS Removal Rate (Å/min) | Trench Loss (Å) | Remaining TEOS Step Height (Å) |
|---|---|---|---|---|---|---|
| 2A (inventive) | — | 0 | 8022 | 10158 | 1754 | 1318 |
| 2B (inventive) | 90:10 | 250 | 7670 | 9452 | 1370 | 1526 |
| 2C (inventive) | 80:20 | 250 | 8017 | 9560 | 1457 | 1518 |
| 2D (inventive) | 70:30 | 250 | 8114 | 9367 | 1078 | 1300 |

These results demonstrate that polishing compositions comprising first abrasive particles according to the invention are particularly effective for polishing substrates comprising a silicon oxide layer (i.e., TEOS), optionally when used in combination with an anionic copolymer. In particular, each of Polishing Compositions 2A-2D exhibited high blanket and pattern TEOS removal rates. Thus, these results demonstrate the desirable removal rate provided by first abrasive particles according to the invention, i.e., wet-process ceria particles having a broad particle size distribution and optimized surface chemistry.

These results further demonstrate that a polishing composition comprising first abrasive particles according to the invention provides improved planarization efficiency when used in combination with an anionic copolymer. In particular, Polishing Composition 2D exhibited a pattern TEOS removal rate that was only slightly lower than the pattern TEOS removal rate of Polishing Composition 2A, but Polishing Composition 2D exhibited a comparable remaining step height with an improvement in trench loss of nearly 700 Å. In addition, Polishing Compositions 2B and 2C showed significant improvements in trench loss as compared to Polishing Composition 2A.

Example 3

This example demonstrates the effectiveness of a polishing composition including first abrasive particles according to the invention and an additive that is a nonionic polymer.

Tetraethoxysilane (TEOS) blanket wafers were polished for 60 seconds with five polishing compositions (i.e., Polishing Compositions 3A-3E). Each of Polishing Compositions 3A-3E contained 0.285 wt. % wet-process ceria particles having a median particle size of about 73 nm, a particle size distribution of about 380 nm, a surface coverage of tridentate hydroxyl groups that is about $2.3 \times 10^{-5}$ moles/m$^2$, and, on a Raman spectrum, a ratio of the intensity of the peak at about 458 cm$^{-1}$ to the intensity of the peak at about 583 cm$^{-1}$ of about 54.8. In addition, each of Polishing Compositions 3A-3E contained 500 ppm picolinic acid and water, and was pH-adjusted to pH 4.0 using triethanolamine. Polishing Compositions 3B-3E also contained a nonionic polymer additive, i.e., polyvinylpyrrolidone having a molecular weight of 40,000, in the amounts listed in Table 6.

TEOS pattern wafers also were polished for 50 seconds with Polishing Compositions 3A and 3D. The TEOS pattern wafers had a 500 μm feature size with 50% density. The TEOS blanket wafers and the TEOS pattern wafers were polished under the same polishing conditions. In particular, the wafers were polished on a Reflexion™ polisher (Applied Materials) with an IC 1010™ pad (Dow Chemical). The polishing parameters were as follows: 22.06 kPa (3.2 psi) downforce, 125 rpm platen speed, 126 rpm head speed, and 200 mL/min polishing flow. Following polishing, the removal rates of the blanket and pattern TEOS (Å/min), trench loss (Å), and remaining TEOS step height (Å) were determined. The results are summarized in Table 6.

TABLE 6

Blanket and Pattern Silicon Oxide Removal Rates, Trench Loss, and Remaining Silicon Oxide Step Height, as a Function of Nonionic Polymer Additive

| Polishing Composition | Amount of Nonionic Polymer (ppm) | Blanket TEOS Removal Rate (Å/min) | Pattern TEOS Removal Rate (Å/min) | Trench Loss (Å) | Remaining TEOS Step Height (Å) |
|---|---|---|---|---|---|
| 3A (inventive) | 0 | 9448 | 12193 | 376 | 533 |
| 3B (inventive) | 10 | 9389 | — | — | — |
| 3C (inventive) | 25 | 9187 | — | — | — |
| 3D (inventive) | 75 | 8354 | 9084 | 243 | 453 |
| 3E (inventive) | 100 | 8339 | — | — | — |

These results demonstrate that polishing compositions comprising first abrasive particles according to the invention are particularly effective for polishing substrates comprising a silicon oxide layer (i.e., TEOS), optionally when used in combination with a nonionic polymer. In particular, Polishing Compositions 3A-3E exhibited high blanket TEOS removal rates, and Polishing Compositions 3A and 3D exhibited high pattern TEOS removal rates.

These results further demonstrate that a polishing composition comprising first abrasive particles according to the invention provides improved planarization efficiency when used in combination with a nonionic polymer. In particular, Polishing Composition 3D exhibited a pattern TEOS removal rate that was somewhat lower than the pattern TEOS removal rate of Polishing Composition 3A, but Polishing Composition 3D exhibited a significant improvement in trench loss and remaining step height as compared to Polishing Composition 3A.

Example 4

This example demonstrates the effectiveness of a polishing composition including first abrasive particles according to the invention and an additive that is a silane.

Tetraethoxysilane (TEOS) blanket wafers were polished with three polishing compositions (i.e., Polishing Compositions 4A-4C). Each of Polishing Compositions 4A-4C contained 0.285 wt. % wet-process ceria particles having a median particle size of about 73 nm, a particle size distribution of about 380 nm, a surface coverage of tridentate hydroxyl groups that is about $2.3\times10^{-5}$ moles/m$^2$, and, on a Raman spectrum, a ratio of the intensity of the peak at about 458 cm$^{-1}$ to the intensity of the peak at about 583 cm$^{-1}$ of about 54.8. In addition, each of Polishing Compositions 4A-4C contained 500 ppm picolinic acid and water, and was pH-adjusted to pH 4.0 using triethanolamine. Polishing Compositions 4B and 4C also contained a silane additive, i.e., aminopropylsilanetriol, in the amounts listed in Table 7.

TEOS pattern wafers also were polished for 50 seconds with Polishing Compositions 4A-4C. The TEOS pattern wafers had a 500 μm feature size with 50% density. The TEOS blanket wafers and TEOS pattern wafers were polished with Polishing Compositions 4A-4C under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the removal rates of the blanket and pattern TEOS (Å/min), trench loss (Å), and remaining TEOS step height (Å) were determined. The results are summarized in Table 7.

TABLE 7

Blanket and Pattern Silicon Oxide Removal Rates, Trench Loss, and Remaining Silicon Oxide Step Height, as a Function of Silane Additive

| Polishing Composition | Amount of Silane (ppm) | Blanket TEOS Removal Rate (Å/min) | Pattern TEOS Removal Rate (Å/min) | Trench Loss (Å) | Remaining TEOS Step Height (Å) |
|---|---|---|---|---|---|
| 4A (inventive) | 0 | 8092 | 10475 | 1418 | 745 |
| 4B (inventive) | 10 | 4641 | 10314 | 1249 | 707 |
| 4C (inventive) | 50 | 2946 | 9763 | 703 | 622 |

These results demonstrate that polishing compositions comprising first abrasive particles according to the invention are particularly effective for polishing substrates comprising a silicon oxide layer (i.e., TEOS), optionally when used in combination with a silane. In particular, Polishing Compositions 4A-4C exhibited high pattern TEOS removal rates. In addition, these results demonstrate the "self-stopping" properties of Polishing Compositions 4B and 4C, which have comparable pattern TEOS removal rates to the pattern TEOS removal rate of Polishing Composition 4A, but which also have lower blanket TEOS removal rates as compared to Polishing Composition 4A. In other words, Polishing Compositions 4B and 4C first polish the pattern TEOS at a very high removal rate, and upon reaching the blanket TEOS, exhibit a reduced removal rate, thereby preventing undesirable trench loss. As illustrated by Table 7, each of Polishing Compositions 4B and 4C exhibited lower trench loss than that of Polishing Composition 4A.

These results further demonstrate that a polishing composition comprising first abrasive particles according to the invention provides improved planarization efficiency when used in combination with a silane. In particular, Polishing Compositions 4B and 4C exhibited pattern TEOS removal rates that were similar to the pattern TEOS removal rate of Polishing Composition 4A, but Polishing Compositions 4B and 4C exhibited improvements in trench loss and remaining step height as compared to Polishing Composition 4A.

Example 5

This example demonstrates the effectiveness of a polishing composition including first abrasive particles according to the invention and an additive that is an N-oxide of a functionalized pyridine.

Tetraethoxysilane (TEOS) pattern wafers were polished with two polishing compositions (i.e., Polishing Compositions 5A and 5B). Each of Polishing Compositions 5A and 5B contained wet-process ceria particles having a median particle size of about 73 nm, a particle size distribution of about 380 nm, a surface coverage of tridentate hydroxyl groups that is about $2.3\times10^{-5}$ moles/m$^2$, and, on a Raman spectrum, a ratio of the intensity of the peak at about 458 cm$^{-1}$ to the intensity of the peak at about 583 cm$^{-1}$ of about 54.8. Each of Polishing Compositions 5A and 5B also contained picolinic acid and water, and was pH-adjusted to pH 4.0 using triethanolamine. In particular, Polishing Composition 5A contained 0.285 wt. % wet-process ceria particles and 500 ppm picolinic acid, while Polishing Composition 5B contained 0.2 wt. % wet-process ceria particles and 350 ppm picolinic acid. Polishing Composition 5B also contained 50 ppm picolinic acid N-oxide.

The TEOS pattern wafers were polished for 50 seconds with Polishing Compositions 5A and 5D. The TEOS pattern wafers had a 500 μm feature size with 50% density. The TEOS pattern wafers were polished with Polishing Compositions 5A and 5B under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the TEOS removal rate (Å/min) and remaining TEOS step height (Å) were determined. The results are summarized in Table 8.

TABLE 8

Pattern Silicon Oxide Removal Rates and Remaining Silicon Oxide Step Height, as a Function of Picolinic Acid N-Oxide Additive

| Polishing Composition | Amount of Picolinic Acid N-Oxide (ppm) | Pattern TEOS Removal Rate (Å/min) | Remaining TEOS Step Height (Å) |
|---|---|---|---|
| 5A (inventive) | 0 | 10532 | 674 |
| 5B (inventive) | 50 | 10536 | 270 |

These results demonstrate that polishing compositions comprising first abrasive particles according to the invention are particularly effective for polishing substrates comprising a silicon oxide layer (i.e., TEOS), optionally when used in combination with an N-oxide of a functionalized pyridine. In particular, each of Polishing Compositions 5A and 5B exhibited high pattern TEOS removal rates.

These results further demonstrate that a polishing composition comprising first abrasive particles according to the invention provides improved planarization efficiency when used in combination with an N-oxide of a functionalized pyridine. In particular, Polishing Composition 5B exhibited a pattern TEOS removal rate that was comparable to the pattern TEOS removal rate provided by Polishing Composition 5A, but Polishing Composition 5B exhibited substantial improvements in remaining step height as compared to Polishing Composition 5A.

Example 6

This example demonstrates the effectiveness of a polishing composition including first abrasive particles according to the invention and an additive that is starch.

Tetraethoxysilane (TEOS) pattern wafers were polished with two polishing compositions (i.e., Polishing Compositions 6A and 6B). Each of Polishing Compositions 6A and 6B contained 0.285 wt. % wet-process ceria particles having a median particle size of about 73 nm, a particle size distribution of about 380 nm, a surface coverage of tridentate hydroxyl groups that is about $2.3 \times 10^{-5}$ moles/m$^2$, and, on a Raman spectrum, a ratio of the intensity of the peak at about 458 cm$^{-1}$ to the intensity of the peak at about 583 cm$^{-1}$ of about 54.8. In addition, each of Polishing Compositions 6A and 6B contained 500 ppm picolinic acid and water, and was pH-adjusted to pH 4.0 using triethanolamine. Polishing Composition 6B also contained 250 ppm starch.

The TEOS pattern wafers were polished for 50 seconds with Polishing Composition 6A, and for 80 seconds with Polishing Composition 6B. The TEOS pattern wafers had a 500 μm feature size with 50% density. The TEOS pattern wafers were polished with Polishing Compositions 6A and 6B under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the TEOS removal rate (Å/min) and remaining TEOS step height (Å) were determined. The results are summarized in Table 9.

TABLE 9

Pattern Silicon Oxide Removal Rates and Remaining Silicon Oxide Step Height, as a Function of Starch Additive

| Polishing Composition | Pattern TEOS Removal Rate (Å/min) | Remaining TEOS Step Height (Å) |
| --- | --- | --- |
| 6A (inventive) | 10532 | 674 |
| 6B (inventive) | 9700 | 64 |

These results demonstrate that polishing compositions comprising first abrasive particles according to the invention are particularly effective for polishing substrates comprising a silicon oxide layer (i.e., TEOS), optionally when used in combination with a starch. In particular, each of Polishing Compositions 6A and 6B exhibited high pattern TEOS removal rates.

These results further demonstrate that a polishing composition comprising first abrasive particles according to the invention provides improved planarization efficiency when used in combination with a starch. In particular, Polishing Composition 6B exhibited a pattern TEOS removal rate that was only slightly lower than the pattern TEOS removal rate provided by Polishing Composition 6A, but Polishing Composition 6B exhibited a significant improvement in remaining step height as compared to Polishing Composition 6A.

Example 7

This example demonstrates the effectiveness of a polishing composition including first abrasive particles according to the invention and an additive that is a cyclodextrin.

Tetraethoxysilane (TEOS) pattern wafers were polished for 50 seconds with five polishing compositions (i.e., Polishing Compositions 7A-7E). Each of Polishing Compositions 7A-7E contained 0.285 wt. % wet-process ceria particles having a median particle size of about 73 nm, a particle size distribution of about 380 nm, a surface coverage of tridentate hydroxyl groups that is about $2.3 \times 10^{-5}$ moles/m$^2$, and, on a Raman spectrum, a ratio of the intensity of the peak at about 458 cm$^{-1}$ to the intensity of the peak at about 583 cm$^{-1}$ of about 54.8. Each of Polishing Compositions 7A-7E also contained 500 ppm picolinic acid and water and was pH-adjusted to pH 4.0 using triethanolamine. Polishing Compositions 7B-7E also contained alpha or beta cyclodextrin in the amounts listed in Table 10.

The TEOS pattern wafers had a 500 μm feature size with 50% density. The TEOS pattern wafers were polished with Polishing Compositions 7A-7E under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the TEOS removal rate (Å/min) and remaining TEOS step height (Å) were determined. The results are summarized in Table 10.

TABLE 10

Pattern Silicon Oxide Removal Rates and Remaining Silicon Oxide Step Height, as a Function of Starch Additive

| Polishing Composition | Type of Cyclo-dextrin | Amount of Cyclo-dextrin (ppm) | Pattern TEOS Removal Rate (Å/min) | Remaining TEOS Step Height (Å) |
| --- | --- | --- | --- | --- |
| 7A (inventive) | — | — | 10532 | 674 |
| 7B (inventive) | Alpha | 35 | 10479 | 528 |
| 7C (inventive) | Alpha | 250 | 10640 | 653 |
| 7D (inventive) | Beta | 35 | 10484 | 592 |
| 7E (inventive) | Beta | 250 | 10631 | 668 |

These results demonstrate that polishing compositions comprising first abrasive particles according to the invention are particularly effective for polishing substrates comprising a silicon oxide layer (i.e., TEOS), optionally when used in combination with a cyclodextrin. In particular, each of Polishing Compositions 7A-7E exhibited high pattern TEOS removal rates.

These results further demonstrate that a polishing composition comprising first abrasive particles according to the invention provides improved planarization efficiency when used in combination with a cyclodextrin. In particular, Polishing Compositions 7B-7E exhibited pattern TEOS removal rates that were comparable to the pattern TEOS removal rate provided by Polishing Composition 7A, but Polishing Compositions 7B-7E exhibited an improvement in remaining step height as compared to Polishing Composition 7A.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of polishing a substrate comprising:
    (i) providing a substrate, wherein the substrate comprises a silicon oxide layer;
    (ii) providing a polishing pad;
    (iii) providing a chemical-mechanical polishing composition comprising:
        (a) first abrasive particles, wherein the first abrasive particles are wet-process ceria particles, have a median particle size of about 40 nm to about 100 nm, are present in the polishing composition at a concentration of about 0.005 wt. % to about 2 wt. %, and have a particle size distribution of at least about 300 nm, wherein the first abrasive particles have a surface that comprises tridentate hydroxyl groups, and wherein the first abrasive particles have a surface coverage of tridentate hydroxyl groups that is about $2.0 \times 10^{-5}$ moles/m$^2$ or more,
        (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm,
        (c) a pH-adjusting agent, and
        (d) an aqueous carrier,
    wherein the pH of the polishing composition is about 1 to about 6;
    (iv) contacting the substrate with the polishing pad and the chemical-mechanical polishing composition; and
    (v) moving the polishing pad and the chemical-mechanical polishing composition relative to the substrate to abrade at least a portion of the silicon oxide layer on a surface of the substrate to polish the substrate.

2. The method of claim 1, wherein a Raman spectrum of the first abrasive particles comprises a peak at about 458 cm$^{-1}$ and a peak at about 583 cm$^{-1}$, and wherein the ratio of the intensity of the peak at about 458 cm$^{-1}$ to the intensity of the peak at about 583 cm$^{-1}$ is about 100 or less.

3. The method of claim 1, wherein the first abrasive particles are present in the polishing composition at a concentration of about 0.1 wt. % to about 0.5 wt. %.

4. The method of claim 1, wherein the functionalized heterocycle comprises a functionalized nitrogen-containing heterocycle selected from picolinic acid, quinaldic acid, and combinations thereof.

5. The method of claim 1, wherein the pH-adjusting agent is selected from an alkyl amine, an alcohol amine, a quaternary amine hydroxide, ammonia, and combinations thereof.

6. The method of claim 5, wherein the pH-adjusting agent is triethanolamine.

7. The method of claim 1, wherein the pH of the polishing composition is about 3.5 to about 5.

8. The method of claim 1, wherein the polishing composition further comprises an additive selected from
    an anionic copolymer of a carboxylic acid monomer, a sulfonated monomer, or a phosphonated monomer, and an acrylate, a polyvinylpyrrolidone, or a polyvinylalcohol,
    a nonionic polymer, wherein the nonionic polymer is polyvinylpyrrolidone or polyethylene glycol,
    a silane, wherein the silane is an amino silane, an ureido silane, or a glycidyl silane,
    an N-oxide of a functionalized pyridine,
    a starch,
    a cyclodextrin, and
    combinations thereof,
    wherein the additive is present in the chemical-mechanical polishing composition at a concentration of about 25 ppm to about 500 ppm.

9. The method of claim 8, wherein the additive is selected from a copolymer of 2-hydroxyethylmethacrylic acid and methacrylic acid, polyvinylpyrrolidone, aminopropylsilanetriol, picolinic acid N-oxide, starch, alpha-cyclodextrin, beta-cyclodextrin, and combinations thereof.

10. The method of claim 1, wherein the polishing composition further comprises:
    a cationic polymer, wherein the cationic polymer is a quaternary amine, and wherein the cationic polymer is present in the polishing composition at a concentration of about 1 ppm to about 250 ppm, and
    a carboxylic acid, wherein the pKa of the carboxylic acid is about 1 to about 6, and wherein the carboxylic acid is present in the polishing composition at a concentration of about 25 ppm to about 500 ppm,
    wherein the pH of the polishing composition is within about 2 units of the pKa of the carboxylic acid.

11. The method of claim 10, wherein the cationic polymer is poly(vinylimidazolium).

12. The method of claim 10, wherein the pKa of the carboxylic acid is about 3.5 to about 5.

13. The method of claim 12, wherein the carboxylic acid is acetic acid.

14. The method of claim 1, wherein the polishing composition further comprises a cationic polymer selected from a cationic polyvinyl alcohol and a cationic cellulose, wherein the cationic polymer is present in the polishing composition at a concentration of about 1 ppm to about 250 ppm.

* * * * *